United States Patent
Nakamizo et al.

(10) Patent No.: US 12,105,182 B2
(45) Date of Patent: Oct. 1, 2024

(54) DATA PROCESSING DEVICE AND RADAR DEVICE

(71) Applicant: Mitsubishi Electric Corporation, Tokyo (JP)

(72) Inventors: Takamichi Nakamizo, Tokyo (JP); Hiroshi Sakamaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/277,780

(22) PCT Filed: Feb. 25, 2022

(86) PCT No.: PCT/JP2022/007965
§ 371 (c)(1),
(2) Date: Aug. 18, 2023

(87) PCT Pub. No.: WO2022/181778
PCT Pub. Date: Sep. 1, 2022

(65) Prior Publication Data
US 2024/0053462 A1    Feb. 15, 2024

(30) Foreign Application Priority Data

Feb. 25, 2021    (JP) ................................ 2021-028208

(51) Int. Cl.
    *G01S 13/53*      (2006.01)
    *G01S 13/22*      (2006.01)

(52) U.S. Cl.
    CPC ............ *G01S 13/53* (2013.01); *G01S 13/227* (2013.01)

(58) Field of Classification Search
    CPC ............................... G01S 13/53; G01S 13/227
(Continued)

(56) References Cited

U.S. PATENT DOCUMENTS 4,472,785 A * 9/1984 Kasuga .............. H03H 17/0288
                                          708/313
4,803,684 A * 2/1989 Kozuki ............... G06F 11/0793
(Continued)

FOREIGN PATENT DOCUMENTS

EP      1295448 B1 * 5/2007 ....... H04L 25/03057
EP      2257838 B1 * 6/2015 ............. G01V 1/364
(Continued)

OTHER PUBLICATIONS

International Search Report and Written Opinion dated Mar. 29, 2022, received for PCT Application PCT/JP2022/007965, filed on Feb. 25, 2022, 8 pages including English Translation.
(Continued)

*Primary Examiner* — Nuzhat Pervin
(74) *Attorney, Agent, or Firm* — XSENSUS LLP

(57) ABSTRACT

The data processing device includes a virtual data sequence generator to extrapolate an approximate line approximating a temporal change of an input data sequence being inputted from outside and is a sequence of data at time points of a predetermined first number that are arranged in succession with at a predetermined time interval to a head or a tail of input data sequence and to generate a virtual data sequence being a sequence of data representing values on extrapolated approximate line at time points of a predetermined second number that are arranged in succession with the time interval, the time points including a time point being adjacent to input data sequence, a data sequence connector to generate a processed data sequence being a data sequence in which virtual data sequence is connected to input data sequence on a side where approximate line of input data sequence is extrapolated.

40 Claims, 16 Drawing Sheets

(58) Field of Classification Search
USPC .......................................................... 342/61
See application file for complete search history.

(56) References Cited

U.S. PATENT DOCUMENTS

| | | | | |
|---|---|---|---|---|
| 4,835,723 | A * | 5/1989 | Hansen | H03H 17/0621 708/313 |
| 5,576,983 | A * | 11/1996 | Shiokawa | H04L 25/03019 708/622 |
| 5,823,964 | A | 10/1998 | Liu et al. | |
| 5,913,824 | A * | 6/1999 | Ogasawara | G01S 15/8981 600/455 |
| 7,110,448 | B2 * | 9/2006 | Bergmans | H04L 7/0029 |
| 7,209,634 | B2 * | 4/2007 | Ono | H04N 7/0135 348/E7.003 |
| 7,982,666 | B2 * | 7/2011 | Bachmann | G01S 7/414 342/134 |
| 8,019,172 | B2 * | 9/2011 | Hahn | G06T 3/4084 382/254 |
| 8,402,072 | B2 * | 3/2013 | Ikada | G06F 17/148 708/200 |
| 8,659,330 | B2 * | 2/2014 | Ichiyama | H03H 11/04 327/551 |
| 8,688,862 | B1 * | 4/2014 | Alley | G01R 31/3177 710/72 |
| 9,292,476 | B2 * | 3/2016 | Tang | G06F 17/142 |
| 10,598,765 | B2 * | 3/2020 | Hode | H03H 17/0213 |
| 10,921,441 | B2 * | 2/2021 | Furuta | G01S 13/9094 |
| 11,508,389 | B2 * | 11/2022 | Wada | G10L 21/0232 |
| 2004/0228612 | A1 * | 11/2004 | Ono | H04N 5/781 348/E7.003 |
| 2008/0063352 | A1 * | 3/2008 | Hahn | G06T 3/4084 386/239 |
| 2010/0046647 | A1 * | 2/2010 | Nerella | H04L 27/2626 375/260 |
| 2010/0134345 | A1 * | 6/2010 | Ruggiano | G01S 7/285 342/159 |
| 2010/0235415 | A1 * | 9/2010 | Ikada | G06F 17/148 708/401 |
| 2012/0143834 | A1 * | 6/2012 | Ebiyama | H03M 7/30 707/693 |
| 2013/0222059 | A1 * | 8/2013 | Kilambi | H04B 1/0475 330/149 |
| 2013/0342382 | A1 | 12/2013 | Maeno | |
| 2015/0139447 | A1 * | 5/2015 | Greenhoe | H03H 17/04 381/98 |
| 2016/0061944 | A1 * | 3/2016 | Minowa | G01S 7/2806 342/159 |
| 2016/0307293 | A1 * | 10/2016 | Murahashi | G06F 18/22 |
| 2017/0343661 | A1 * | 11/2017 | Morita | G01S 7/282 |
| 2021/0116534 | A1 * | 4/2021 | Hode | H03H 17/0213 |
| 2021/0287650 | A1 * | 9/2021 | Wada | G10K 11/17853 |
| 2022/0239530 | A1 * | 7/2022 | Wagner | H04L 25/0224 |

FOREIGN PATENT DOCUMENTS

| | | |
|---|---|---|
| JP | H10-127640 A | 5/1998 |
| JP | 2002-131421 A | 5/2002 |
| JP | 2003-149327 A | 5/2003 |
| JP | 2008-099061 A | 4/2008 |
| JP | 2014-025916 A | 2/2014 |

OTHER PUBLICATIONS

Notice of Reasons for Refusal dated Aug. 23, 2022, received for JP Application 2022-540456, 4 pages including English Translation.
Decision to Grant dated Nov. 1, 2022, received for JP Application 2022-540456, 4 pages including English Translation.
Office Action dated Aug. 16, 2022, received for JP Application 2022-540456, 2 pages including English Translation.
Office Action issued Jul. 2, 2024 in European Patent Application No. 22759812.5, 14 pages.

* cited by examiner

DATA PROCESSING DEVICE AND RADAR DEVICE

CROSS-REFERENCE TO RELATED APPLICATIONS

This application is based on PCT filing PCT/JP2022/007965, filed Feb. 25, 2022, which claims priority from Japanese Patent Application No. 2021-028208, filed Feb. 25, 2021, the entire contents of each are incorporated herein by reference.

TECHNICAL FIELD

The present disclosure relates to a data processing device including an infinite impulse response filter that reduces a low frequency component of a data sequence inputted periodically, and relates to a radar device including the data processing device.

BACKGROUND ART

Examples of a device including a data processing device that processes a data sequence inputted periodically include a radar. A low frequency component of the data sequence to be reduced in the radar is, for example, ground clutter. Conventionally, an infinite impulse response filter (IIR filter), a finite impulse response filter (FIR filter), or the like, which is a time domain filter, is used to remove or reduce ground clutter in a Doppler radar used as a weather radar or the like (see PTLs 1 and 2).

There is a technique of reducing a front ghost and a rear ghost efficiently without generating a grandchild ghost in an input signal including an intended signal and interference signals (the front ghost and the rear ghost) caused by the intended signal by changing an initial value of an IIR filter (see PTL 3).

CITATION LIST

Patent Literatures

PTL 1: Japanese Patent Laid-Open No. 2002-131421
PTL 2: Japanese Patent Laid-Open No. 2003-149327
PTL 3: Japanese Patent Laid-Open No. 2008-99061

SUMMARY OF INVENTION

Technical Problem

However, in the technique of reducing a ground clutter component using an IIR filter in a conventional Doppler radar device, there is a problem that a sufficient reduction amount cannot be obtained when the number of data points of reception signal data obtained by processing a reception signal is small. Each of the reception signal data is represented by a complex number. The reception signal data are also referred to as IQ data. The number of data points of the reception signal data is determined by a pulse repetition cycle and an antenna rotation speed (antenna scanning speed) of the Doppler radar device. Therefore, in order to obtain a large number of data points, either an observation distance or an observation time is deteriorated in the radar device.

As a method of widening a measurement range of a Doppler velocity, there is a method of changing the pulse repetition cycle for each prescribed period. If the pulse repetition cycle is changed, the data obtained before the change cannot be used as the equivalent data obtained after the change, and a sufficient number of data points cannot be obtained.

The present disclosure has been made to solve the above-described problem, and an object of the present disclosure is to obtain a data processing device capable of reducing a low frequency component more as compared with the prior art when the number of data points of a data sequence that is inputted is small.

Solution to Problem

A data processing device of the present disclosure includes an approximate line calculator to calculate an approximate line approximating a temporal change of an input data sequence being a sequence of data at time points of a predetermined first number, the time points of the first number being arranged in succession with a predetermined time interval, the input data sequence being inputted from outside, a virtual data sequence generator to extrapolate the approximate line to a head or a tail of the input data sequence and to generate a virtual data sequence being a sequence of data representing values on the extrapolated approximate line at time points of a predetermined second number, the time points of the second number being arranged in succession with the time interval, and including a time point being adjacent to the input data sequence, a data sequence connector to generate a processed data sequence being a data sequence in which the virtual data sequence is connected to the input data sequence on a side where the approximate line of the input data sequence is extrapolated, an infinite impulse response (IIR) filter to process a data sequence that is inputted and to output a data sequence in which a low frequency component is reduced as compared with a data sequence that is inputted, the low frequency component being a component varying at a low frequency, a data sequence inputter to input data included in the processed data sequence to the IIR filter sequentially, and an outputter to output the data sequence outputted from the IIR filter to the outside.

A data processing device of the present disclosure includes an infinite impulse response (IIR) filter to process a data sequence that is inputted and to output a data sequence in which a low frequency component is reduced as compared with the data sequence that is inputted, the low frequency component being a component varying at a low frequency, a data sequence inputter to input data to the IIR filter sequentially from a head or a tail of an input data sequence, the input data sequence being inputted from outside, and being a sequence of data at time points of a predetermined first number, the time points of the first number being arranged in succession with a predetermined time interval, a filter internal state estimator to obtain a value of an internal state variable of the IIR filter when a same datum as a first datum is inputted to the IIR filter an infinite number of times, a filter internal state setter to set a value of the internal state variable obtained by the filter internal state estimator to the internal state variable of the IIR filter before the data sequence inputter inputs the first datum to the IIR filter, and an outputter to output the data sequence outputted from the IIR filter to the outside.

Advantageous Effects of Invention

The data processing device of the present disclosure can reduce the low frequency component in the data sequence that is inputted more as compared with the prior art.

DESCRIPTION OF EMBODIMENTS

First Embodiment

Figure 1:
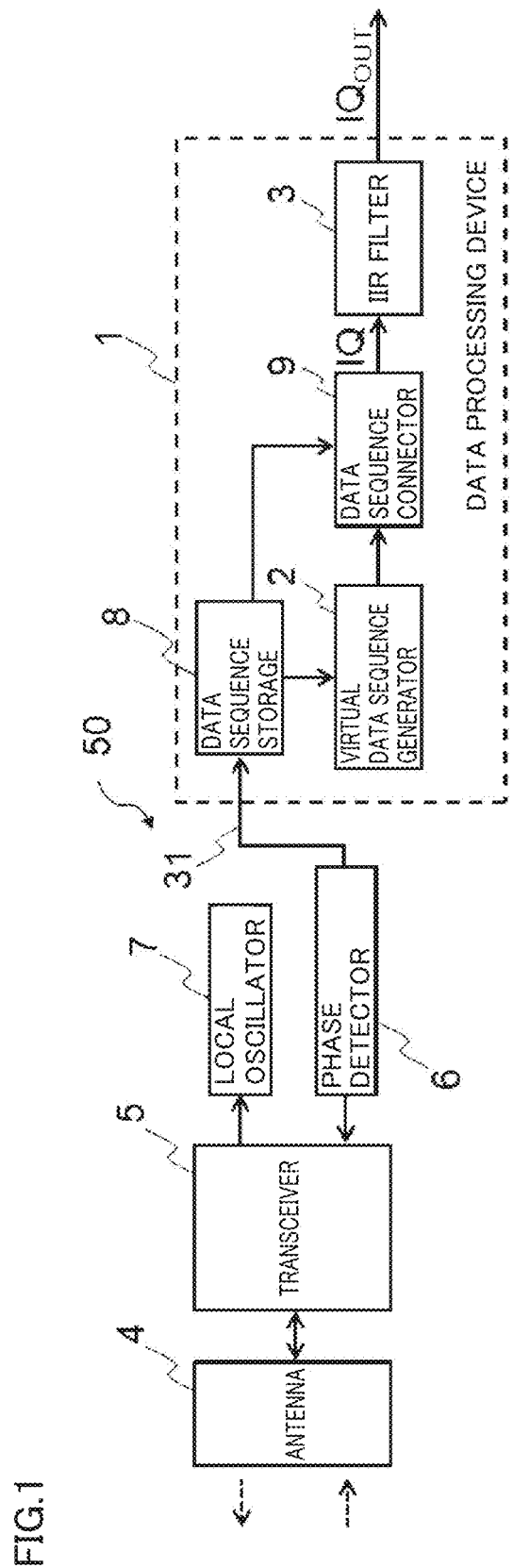
FIG. 1 is a functional block diagram of a radar device including a data processing device according to a first embodiment.
Figure 2:
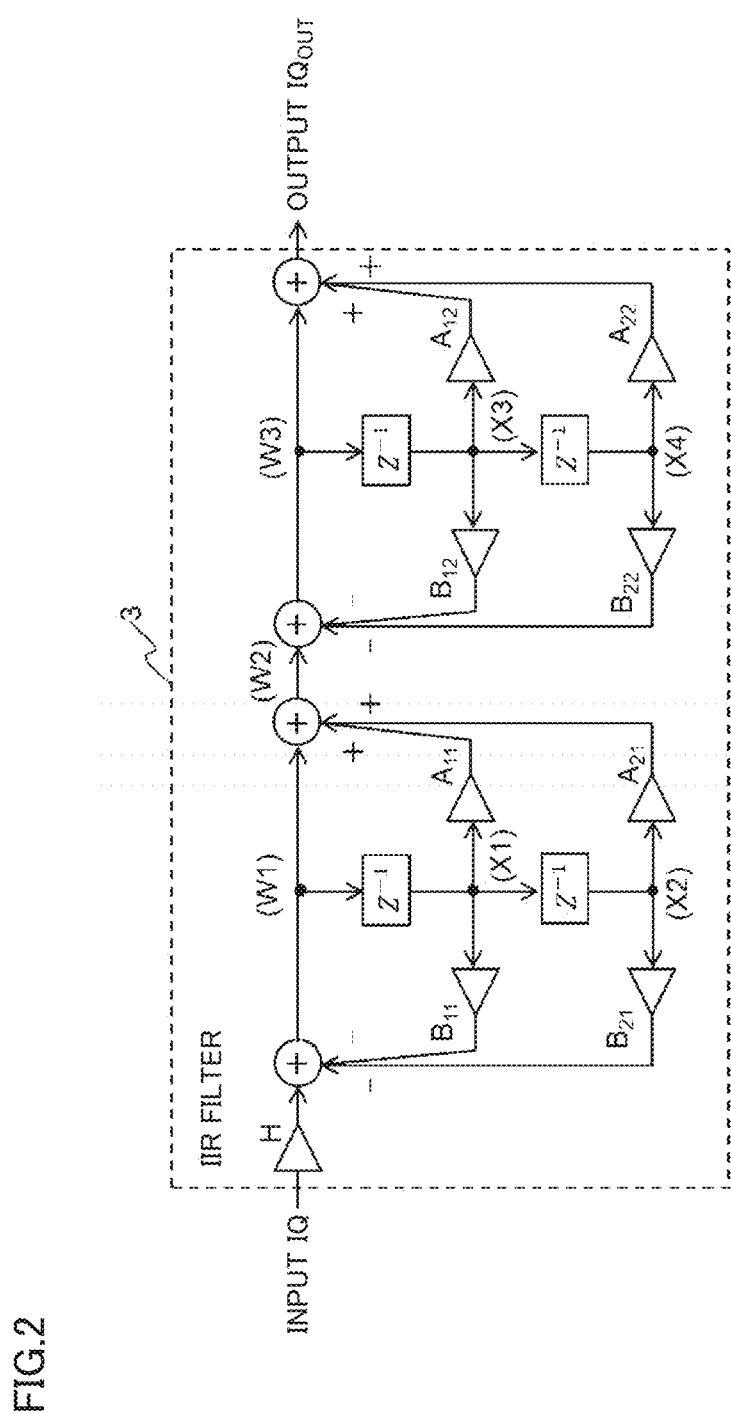
FIG. 2 is a functional block diagram of an infinite impulse response (IIR) filter included in the data processing device according to the first embodiment.
Figure 3:
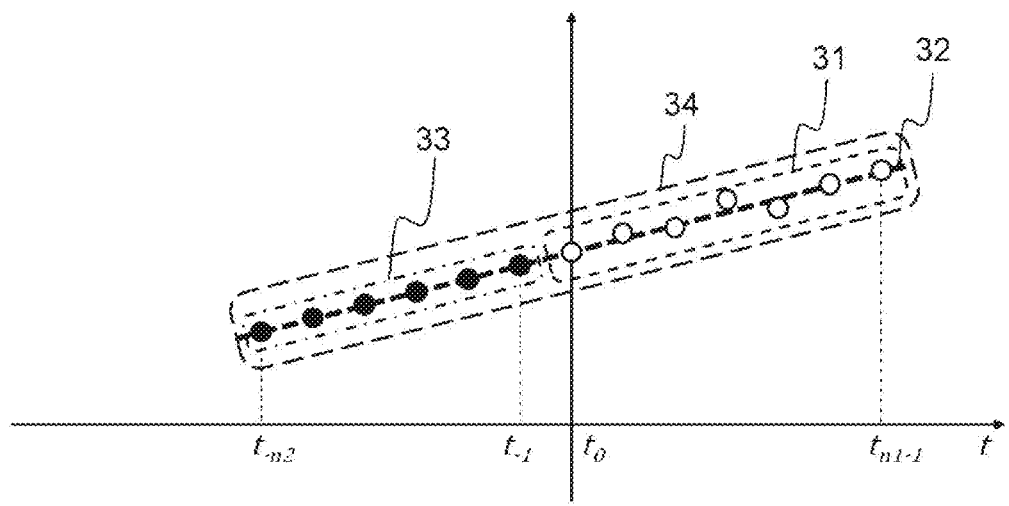
FIG. 3 is a diagram for describing a virtual data sequence generated by the data processing device according to the first embodiment.
Figure 4:
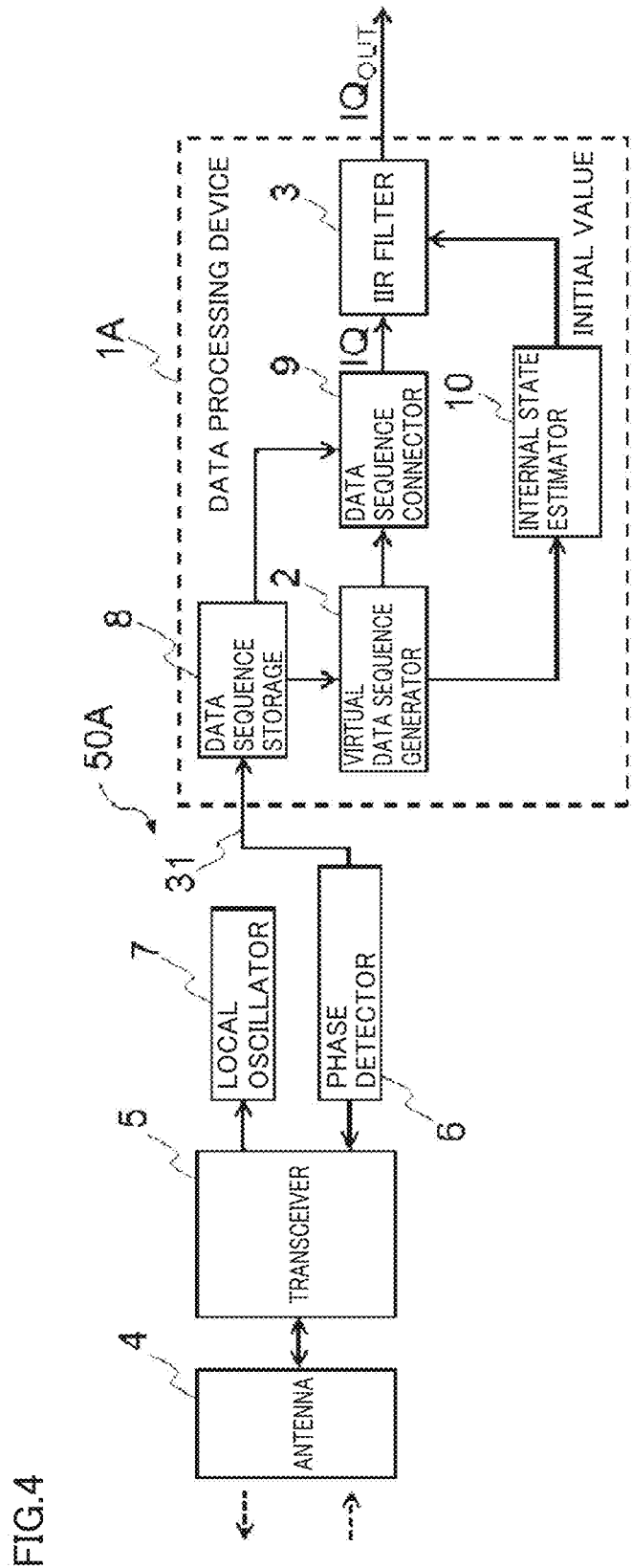
FIG. 4 is a functional block diagram of a radar device including a modification of the data processing device according to the first embodiment.
Figure 5:
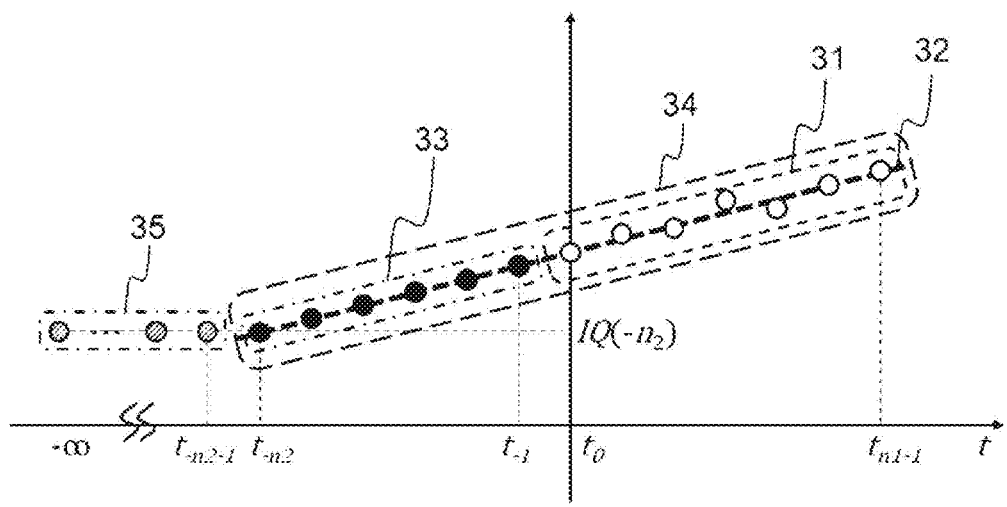
FIG. 5 is a diagram for describing a virtual data sequence and an assumed infinite data sequence generated by the modification of the data processing device according to the first embodiment.

First, a data processing device according to a first embodiment is described with reference to FIGS. 1, 2, and 3. In this specification, a case where the data processing device is used in a radar device is described. Next, a modification of the data processing device according to the first embodiment is described with reference to FIGS. 2, 4, and 5. FIG. 1 is a functional block diagram of a radar device 50 including a data processing device 1 according to the first embodiment. FIG. 2 is a functional block diagram of an infinite impulse response (IIR) filter included in data processing device 1. FIG. 3 is a diagram for describing a virtual data sequence 33 generated by data processing device 1. FIG. 4 is a functional block diagram of a radar device 50A including a data processing device 1A as a modification of the data processing device according to the first embodiment. FIG. 5 is a diagram for describing virtual data sequence 33 generated by data processing device 1A.

An IIR filter 3 shown in FIG. 2 is an example of the IIR filter. The IIR filter may have a configuration different from the configuration shown in FIG. 2. That is, the infinite impulse response filter (IIR filter) may have any configuration that can be used for reducing ground clutter in a radar device such as a Doppler radar. In a case where the IIR filter is used in a device different from the radar device, the IIR filter may have any configuration as long as a low frequency component can be reduced from a data sequence that is inputted.

In FIG. 1, data processing device 1 (data processing device according to the first embodiment) is a data processing device that removes or reduces a variation of a low frequency component from a data sequence generated from a reception signal in a radar device. A data sequence to be processed by data processing device 1 is a reception signal data sequence that is a sequence of reception signal data each generated for each pulse from reception of a reflected wave in which a pulse of an electromagnetic wave emitted into a space at a pulse repetition cycle is reflected by an observation target in the space. Specifically, a data sequence of amplitudes or phases of IQ data each generated sequentially for each pulse by performing phase detection for a reception signal generated from reception of a reflected wave is a reception signal data sequence. Data processing device 1 is a reception signal data processing device included in radar device 50, the reception signal data processing device processing a reception signal data sequence. Data processing device 1 reduces a low frequency component included in the reception signal data sequence, that is, a ground clutter component. The IQ data are detection data each represented by one complex number obtained by phase detection for each of the pulse.

As shown in FIG. 1, radar device 50 includes an antenna 4, a transceiver 5, a phase detector 6, a local oscillator 7, and data processing device 1. Antenna 4 emits a pulse of an electromagnetic wave (transmission wave) into a space at the pulse repetition cycle, and receives sequentially an electromagnetic wave (reflected wave) which is a transmission wave reflected by an observation target in the space. When the observation target is a wind speed or a wind direction, aerosol floating in the air is the observation target. Transceiver 5 is connected to antenna 4, and performs processing of transmitting a transmission wave from antenna 4 and processing of receiving a reception signal generated by antenna 4 receiving a reflected wave. Transceiver 5 performs transmission processing that is processing of supplying a transmission signal to be transmitted as a transmission wave to antenna 4, and performs reception processing that processes the reception signal generated by antenna 4 receiving reflected waves sequentially. In the transmission processing, a pulse transmission signal is supplied to antenna 4 at a pulse repetition cycle, which is determined in advance, so that a transmission wave is transmitted from antenna 4 at the pulse repetition cycle. In the reception processing, antenna 4 receives and processes reception signals generated by receiving reflected waves reflected by the observation target sequentially. Transceiver 5 sends the reception signal processed with the reception processing to phase detector 6. Phase detector 6 performs phase detection for the reception signal sent from transceiver 5 and generates IQ data which are reception signal data each represented by a complex number. Phase detector 6 sends amplitudes or phases of the generated IQ data to data processing device 1. Local oscillator 7 supplies, to transceiver 5, a reference signal from which transceiver 5 generates a transmission signal. Transceiver 5 performs frequency conversion for the reference signal to generate a transmission signal that is a high frequency signal.

A data sequence that is a sequence of a datum indicating an amplitude or phase value of a complex number representing a datum included in IQ data generated sequentially by phase detector 6 is inputted to data processing device 1. The number of data in the data sequence processed at a time by data processing device 1 is fixed. The number of data in the data sequence processed at a time is referred to as a first number. The first number represented by an integer is denoted by a variable $n_1$. The first number is a finite value. Data processing device 1 outputs a data sequence in which a low frequency component, which is a component varying at a low frequency, is reduced with respect to the data sequence that is inputted. Data processing device 1 includes a data sequence storage 8, a virtual data sequence generator 2, a data sequence connector 9, and IIR filter 3.

Data sequence storage 8 stores an input data sequence 31 (shown in FIG. 3) which is a data sequence inputted from outside of data processing device 1 sequentially. Input data sequence 31 is a sequence of data at time points that are arranged in succession with a time interval determined by the pulse repetition cycle.

Virtual data sequence generator 2 calculates an approximate line 32 (shown in FIG. 3) that approximates a temporal change of input data sequence 31, and generates virtual data sequence 33 on the basis of input data sequence 31 and approximate line 32. Virtual data sequence generator 2 is also an approximate line calculator that calculates approximate line 32 that approximates the temporal change of input data sequence 31. Virtual data sequence generator 2 extrapolates approximate line 32 to a head of input data sequence 31 and generates virtual data sequence 33 which is a sequence of virtual data from extrapolated approximate line 32. Virtual data sequence 33 is a sequence of data representing values on extrapolated approximate line 32 at time points of a predetermined number that are arranged in succession with the time interval, the time points including a time point that is adjacent to input data sequence 31. The input data are data actually observed by radar device 50, and can be said to be "actual data" in contrast with virtual data. The number of data included in virtual data sequence 33 is referred to as a second number. The second number represented by an integer is denoted by a variable $n_2$. The second number is a finite value.

Data sequence connector 9 generates a processed data sequence 34 which is a data sequence in which input data sequence 31 and virtual data sequence 33 are connected. In processed data sequence 34, virtual data sequence 33 and input data sequence 31 are connected such that virtual data sequence 33 is located at time points before input data sequence 31. Data are inputted to IIR filter 3 sequentially starting from a datum with an earliest time in processed data sequence 34. Data sequence connector 9 is also a data sequence inputter that inputs the data included in processed data sequence 34 to the IIR filter sequentially. Data sequence connector 9 is also the data sequence inputter that inputs data to IIR filter 3 from a datum at the end of processed data sequence 34 on the side corresponding to virtual data sequence 33. IIR filter 3 reduces a low frequency component in the data sequence that is inputted and outputs a data sequence in which the low frequency component is reduced. The output of IIR filter 3 is the output of data processing device 1. An output terminal of IIR filter 3 is an outputter that outputs the data sequence outputted from IIR filter 3 to the outside of data processing device 1. Data processing device 1 may include a terminal or a device different from the output terminal of IIR filter 3 as the outputter of data processing device 1. In the case of radar device 50, the low frequency component reduced by IIR filter 3 is a component (ground clutter component) due to ground clutter in the reception signal.

Virtual data sequence generator 2 extrapolates approximate line 32 to the head of input data sequence 31 to generate virtual data sequence 33 which is a sequence of data representing values on extrapolated approximate line 32 at time points of the predetermined second number that are arranged in succession with the time interval, the time points including the time point being adjacent to input data sequence 31. Data sequence connector 9 generates processed data sequence 34 which is a data sequence in which virtual data sequence 33 is connected to a front side of input data sequence 31.

IIR filter 3 shown in FIG. 2 is a quartic IIR filter. The IIR filter shown in FIG. 2 includes filters having similar configurations in two stages. A filter having a similar configuration includes two time delay elements, and is configured to feed-back and feed-forward values at one time point before and two time points before. In FIG. 2, a multiplier that multiplies an input of the multiplier by a constant is represented by a triangle, and the constant to be multiplied is drawn near the triangle. A datum inputted to IIR filter 3 is denoted by a variable IQ, and data outputted from IIR filter 3 is denoted by a variable $IQ_{OUT}$. IIR filter 3 has internal state variables denoted by variables W1, W2, W3, X1, X2, X3, and X4. All internal state variables of IIR filter 3 are initialized to 0 before the first datum is inputted to IIR filter 3.

A detailed operation of virtual data sequence generator 2 is described with reference to FIG. 3. First, virtual data sequence generator 2 calculates approximate line 32 for points obtained by plotting, along a time axis, a plurality of data (data included in input data sequence 31) indicating amplitude values or phase values of the IQ data generated sequentially. A sequence of points plotted by white circles in FIG. 3 is input data sequence 31 that is inputted. A line indicated by a broken line is approximate line 32 that is calculated. Approximate line 32 is a line that approximates the temporal change of input data sequence 31. The approximate line may be a straight line or a curved line. The approximate line may be a line connecting a plurality of straight lines or curved lines. Approximate line 32 may be obtained by a general method such as a least squares method or polynomial approximation. In the diagram such as FIG. 3 representing the temporal change of the data sequence, the datum included in input data sequence 31 is represented by a white circle. A black circle represents a datum included in virtual data generated virtually.

Next, virtual data sequence generator 2 extrapolates approximate line 32 to the side (front side) of the time before input data sequence 31 is inputted on the time axis (horizontal axis in FIG. 3). A virtual data sequence 33 is arranged on extrapolated approximate line 32, has the same arrangement period as input data sequence 31, and is arranged adjacent to input data sequence 31 in the arrangement period. Virtual data sequence 33 is a sequence of data representing values on extrapolated approximate line 32 at a plurality of time points that are arranged in succession with the time interval, the plurality of time points including the time point being adjacent to input data sequence 31. Second number $n_2$, which is the number of data in virtual data sequence 33, is substantially equal to first number $n_1$, which is the number of data in input data sequence 31. The larger second number $n_2$, the more desirable. It is desirable to set second number $n_2$ as large as possible within a range where approximation by approximate line 32 is appropriate.

Data sequence connector 9 connects virtual data sequence 33 generated by virtual data sequence generator 2 and input data sequence 31 stored in data sequence storage 8 to generate processed data sequence 34. Data sequence connector 9 connects virtual data sequence 33 to be arranged ahead in time. Data sequence connector 9 inputs processed data sequence 34 to IIR filter 3 in order starting from the earliest data.

In data processing device 1, the number of data inputted to IIR filter 3 is $n_1+n_2$. When $n_2=n_1$ is satisfied, $2n_1$ data are inputted to IIR filter 3. It is known that IIR filter 3 cannot reduce a low frequency component sufficiently when the number of input data is small. Since the number of data in data sequence that is inputted can be about twice or more, IIR filter 3 can reduce the low frequency component in the data sequence that is inputted more as compared with the prior art.

As described above, in a case where the number of data points of input data sequence 31 is small, data processing device 1 can reduce an intended low frequency component (ground clutter component) more as compared with the prior art with a high probability. The criterion for determining whether the number of data points is large or small and the number set as second number $n_2$ (the number of data points of virtual data) are determined by the pulse repetition cycle, an antenna rotation speed (antenna scanning speed) of radar device 50 which is a Doppler radar device, and the degree of required reduction in ground clutter.

The modification of data processing device 1 is described with reference to FIGS. 2, 4, and 5. In data processing device 1A of the modification, an initial value of the internal state variable of IIR filter 3 is determined on the assumption that a virtual data sequence including an infinite number of data is inputted.

In FIG. 4, data processing device 1A includes an internal state estimator 10. IIR filter 3 is configured to be able to be set its internal state variable externally. Internal state estimator 10 estimates the initial value of the internal state variable of IIR filter 3, and sets the estimated initial value of the internal state variable as the internal state variable of IIR filter 3. Virtual data sequence generator 2 generates virtual data sequence 33 which is a sequence of second number $n_2$ of virtual data before input data sequence 31. A time point at which a datum at the head of input data sequence 31 is inputted is denoted by a variable $t_0$. The datum at the head of input data sequence 31 is denoted by a variable IQ (0). The earliest time point among $n_2$ virtual data included in virtual data sequence 33 is denoted by a variable $t_{-n2}$, and the value of the virtual datum at a time point $t_{-n2}$ is denoted by a variable IQ $(-n_2)$. Internal state estimator 10 assumes that an infinite number of data having a value of IQ $(-n_2)$ exists on the front side of virtual data sequence 33. That is, internal state variable of IIR filter 3 is estimated on the assumption that the following equation (1) holds.

Where every n satisfies $n \leq -n_2$, $$IQ(n) = IQ(-n_2) \quad (1)$$

Virtual data sequence 33 used by data processing device 1A is described with reference to FIG. 5. First, as shown in FIG. 3, virtual data sequence generator 2 calculates approximate line 32 for points obtained by plotting data included in input data sequence 31 and being inputted sequentially along the time axis. A white circle is a datum included in input data sequence 31. A line indicated by a broken line is approximate line 32 approximating input data sequence 31. FIG. 3 shows a case where input data sequence 31 is approximated by a straight line. The approximate line may be a curved line.

Next, virtual data sequence generator 2 extrapolates approximate line 32 to the side of the time before input data sequence 31 is inputted on the time axis (horizontal axis in FIG. 3). Then, virtual data sequence generator 2 generates second number $n_2$ of virtual data on extrapolated approximate line 32 as shown in FIG. 3. FIG. 5 also shows an assumed infinite data sequence 35 which is virtual data used by internal state estimator 10. Assumed infinite data sequence 35 is represented by shaded circles in the drawing. Assumed infinite data sequence 35 is a sequence (set) of data satisfying equation (1).

A method for determining the initial value of the internal state variable in IIR filter 3 is described. IIR filter 3 has the configuration shown in FIG. 2. IIR filter 3 has W1, W2, W3, X1, X2, X3, and X4 as the internal state variables. In a case where it is assumed that assumed infinite data sequence 35 is inputted to IIR filter 3, each internal state variable converges to a value determined at time point $t_{-n2}$. The value at which each internal state variable converges can be calculated by Formula 1 shown below. Assumed infinite data sequence 35 is a sequence of data of an infinite number existing before time point $t_{-n2}$, the data each having the value being IQ $(-n_2)$.

Method of calculating IIR internal state variables $(W1, W2, W3, X1, X2, X3, X4)$ $W1 \ W_1(n) = H \cdot IQ(-n_2) - B_{11}W_1(n-1) - B_{21}W_1(n-2)$ where if $n \to \infty(\infty)$, the value at which $W1(n)$ converges is $W1(\infty)$.

$W_1(\infty) = H \cdot IQ(-n_2) - B_{11}W_1(\infty) - B_{21}W_1(\infty)$ $W_1(\infty) = \dfrac{H \cdot IQ(-n_2)}{1 + B_{11} + B_{21}} = W1$ $W2 \ W_2(n) = W_1(n) + A_1 W_1(n-1) + A_{21} W_1(n-2)$ where if $n \to \infty(\infty)$, the value at which $W2(n)$ converges is $W2(\infty)$.

$W_2(\infty) = W_1(\infty) \cdot (1 + A_{11} + A_{21}) = W2$ $W3 \ W_3(n) = W_2(n) - B_{12}W_3(n-1) - B_{22}W_3$ where if $n \to \infty(\infty)$, the value at which $W3(n)$ converges is $W3(\infty)$.

$W_3(\infty) = W_2(\infty) - B_{12}W_3(\infty) - B_{22}W_3(\infty)$ $W_3(\infty) = \dfrac{W_2(\infty)}{1 + B_{12} + B_{22}} = W3$ $X1, X2 \ W1 = X1 = X2$ $X3, X4 \ W3 = X3 = X4$ $IQ_{OUT} IQ_{OUT} - (1 + A_{12} + A_{22}) \cdot W_3$ Internal state estimator 10 determines the value of each internal state variable by the method shown in Formula 1.

Internal state estimator 10 sets the obtained value as an initial value to each internal variable of IIR filter 3. Data sequence connector 9 inputs processed data sequence 34 to IIR filter 3 in the same order as a lapse of time sequentially, starting with IQ ($-n_2$) which is a datum at an earliest time on the time axis.

Internal state estimator 10 is a filter internal state estimator that obtains a value of each internal state variable of IIR filter 3 when the same datum as the first datum that is a datum to be inputted first to IIR filter 3 is inputted an infinite number of times. Internal state estimator 10 is also a filter internal state setter that sets the value of the internal state variable obtained by the filter internal state estimator in the IIR filter before data sequence connector 9, which is also a data sequence inputter, inputs the first datum to IIR filter 3.

In data processing device 1A of the modification, similarly to data processing device 1, the number of data points inputted to IIR filter 3 can be increased. In a case where the number of data points of input data sequence 31 is small, data processing device 1A can reduce an intended low frequency component more as compared with the prior art with a high probability. Furthermore, each of the internal state variables of IIR filter 3 is initialized to a value that takes in a steady state according to the value of the datum to be inputted first. Therefore, in data processing device 1A, the time required for the internal state variables to change when the internal variables are initialized to zero is not necessary, and the operation of reducing the low frequency component can be started earlier, resulting in a greater effect of reducing the low frequency component.

When the number of virtual data generated by virtual data sequence generator 2 is finite and large, a calculation processing load may become enormous. On the other hand, assuming infinity, it is possible to obtain the converged value uniquely and easily by using the convergence of the state variable. Therefore, there exist some cases in which using the modification of the data processing device according to the first embodiment is suitable.

In a case where data processing device 1A is applied to radar device 50, the initial values (W1, W2, W3, X1, X2, X3, X4) in IIR filter 3 are estimated on the assumption that the data are inputted an infinite number of times from a time point infinitely before until the first datum is inputted as the data before the input data sequence with the number of data points, based on a characteristic that an amplitude variation and a phase variation of the ground clutter included in the IQ data are small. Thus, the ground clutter component can be reduced more effectively than in the prior art.

As described above, the data processing device according to the first embodiment (including the modification) generates the virtual data from the actual data (input data sequence 31) of the IQ data, and thus can secure the number of data points by using the actual data and the virtual data. Therefore, it can be expected to reduce the low frequency component by IIR filter 3 sufficiently.

In the data processing device, the virtual data sequence may be connected to a rear side of the input data sequence. The data processing device may include a virtual data sequence generator that extrapolates an approximate line to the head or the tail of the input data sequence to generate a virtual data sequence that is a sequence of data representing values on the extrapolated approximate line at time points of the predetermined second number that are arranged in succession with the time interval, the time points including the time point that is adjacent to the input data sequence. The data processing device may put the virtual data sequence on an indicated side of the head or the tail of the input data sequence. The data processing device may put the virtual data sequence on the side of either the head or the tail of the input data sequence depending on information inputted from outside. Here, "extrapolating the approximate line to the head or the tail of the input data sequence" means any of "always extrapolating the approximate line to the head of the input data sequence", "always extrapolating the approximate line to the tail of the input data sequence", or "extrapolating the approximate line to the designated side of either the head or the tail of the input data sequence". The same is applied to processing different from "extrapolating the approximate line".

The data processing device may estimate the initial value of the internal state variable of the IIR filter without putting the virtual data sequence, set the estimated initial value to the internal state variable of the IIR filter, and then input the data to the IIR filter. Regardless of whether the virtual data sequence is put or not, the initial value of each of the internal state variables of the IIR filter is required only to be set to the value of the internal state variable of the IIR filter estimated in a state where the datum to be inputted first is inputted an infinite number of times when the data are inputted to the IIR filter from either the head or the tail of the data sequence inputted to the IIR filter.

In a case where the virtual data sequence is not put, the data processing device may input data to the IIR filter from either the head or the tail of the input data sequence. In a case where the virtual data sequence is put, the data processing device may input first, to the IIR filter, a datum at an end of the processed data sequence on the side to which the virtual data sequence is added or a datum at an end of the processed data sequence on the side to which the virtual data sequence is not added.

The data processing device is not required to include the input data sequence storage that stores the input data sequence. The data processing device may be any data processing device as long as the virtual data sequence can be generated from the input data sequence, the processed data sequence obtained by connecting the input data sequence and the virtual data sequence can be generated, and data included in the processed data sequence can be inputted to the IIR filter sequentially.

The data processing device of the present disclosure can be used also in a device different from the radar device. In a device different from the radar device, the data processing device of the present disclosure can also reduce the low frequency component included in the data sequence more as compared with the prior art.

The foregoing is also applied to the following embodiments.

Second Embodiment

Figure 6:
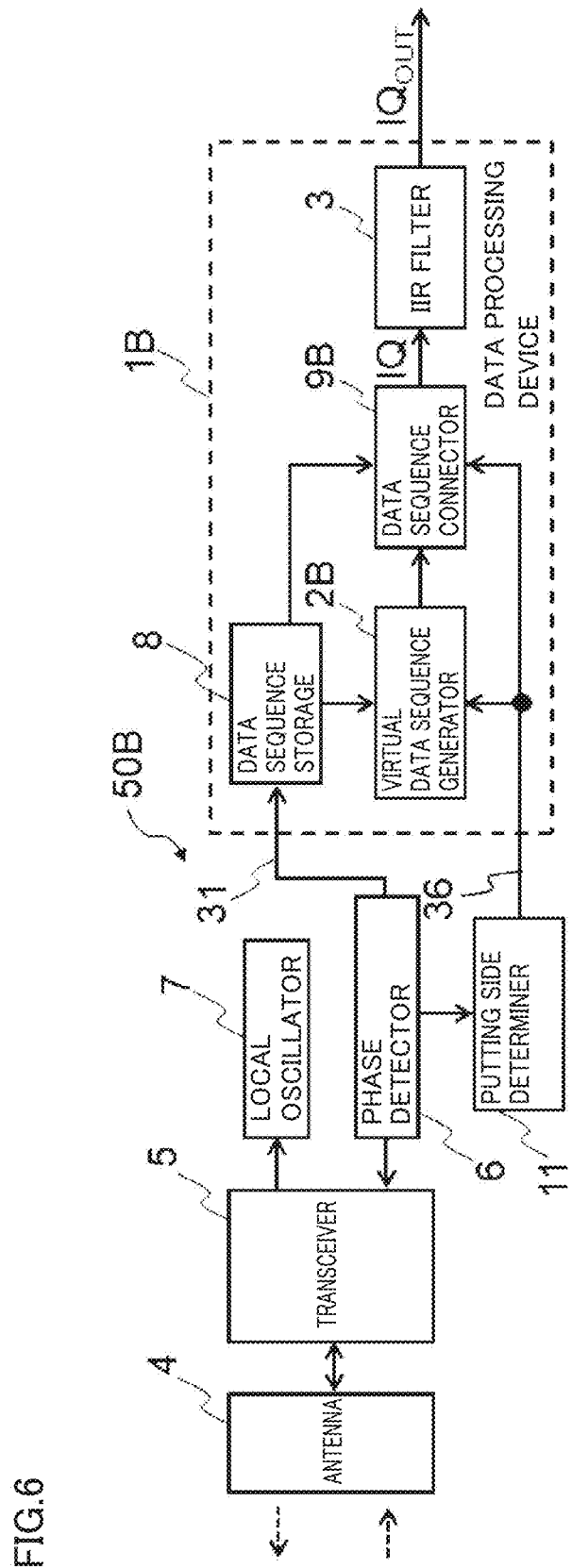
FIG. 6 is a functional block diagram of a radar device including a data processing device according to a second embodiment.
Figure 7:
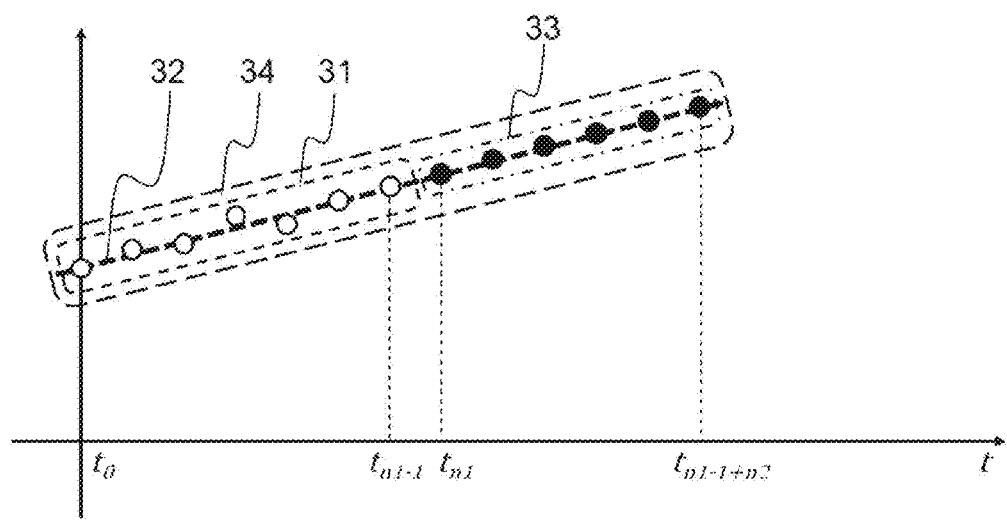
FIG. 7 is a diagram for describing a virtual data sequence generated by the data processing device according to the second embodiment.

A second embodiment is a case where the first embodiment is modified such that virtual data sequence 33 is generated and put on the designated side of either the front side or the rear side of input data sequence 31. A radar device 50B and a data processing device 1B according to the second embodiment are described with reference to FIGS. 6 and 7. FIG. 6 is a functional block diagram of the radar device including the data processing device according to the second embodiment. FIG. 7 is a diagram for describing virtual data sequence 33 generated by the data processing device according to the second embodiment.

In FIG. 6, points different from FIG. 1 in the first embodiment are described. Radar device 50B includes a putting side determiner 11 and data processing device 1B.

Data processing device 1B can put virtual data sequence 33 on either the front side or the rear side of input data sequence 31. Whether data processing device 1B puts on the front side or the rear side of input data sequence 31 is instructed by putting side determiner 11. Putting side determiner 11 determines a putting side 36 indicating whether to put virtual data sequence 33 on the front side or the rear side of input data sequence 31. Input data sequence 31 and putting side 36 are inputted to data processing device 1B.

Putting side determiner 11 determines putting side 36 by comparing the amplitudes of the IQ data from which data at the head and the tail of input data sequence 31 are generated. In a case where the amplitude of the IQ datum corresponding to the head of input data sequence 31 is greater than or equal to the amplitude of the IQ datum corresponding to the tail of input data sequence 31, putting side determiner 11 determines putting side 36 to be the front side. Otherwise, putting side determiner 11 determines putting side 36 to be the rear side. In order to determine putting side 36, the amplitudes of IQ data corresponding to the head and the tail of each input data sequence 31 that is processed by data processing device 1B are inputted from phase detector 6 to putting side determiner 11.

In data processing device 1B, a virtual data sequence generator 2B and a data sequence connector 9B are modified. Putting side 36 is inputted to virtual data sequence generator 2B and data sequence connector 9B. Virtual data sequence generator 2B generates virtual data sequence 33 by extrapolating approximate line 32 to the side designated by putting side 36. In a case where putting side 36 is the front side, virtual data sequence generator 2B operates in a similar manner to virtual data sequence generator 2, and generates virtual data sequence 33 as shown in FIG. 3. In a case where putting side 36 is the rear side, virtual data sequence generator 2B generates virtual data sequence 33 as shown in FIG. 7 as an example. Virtual data sequence generator 2B extrapolates approximate line 32 to a side (rear side) of time after input data sequence 31 is inputted. Virtual data sequence generator 2B generates a virtual data sequence 33 that is arranged on extrapolated approximate line 32, has the same arrangement period as input data sequence 31, and is arranged adjacent to input data sequence 31 in the arrangement period.

Virtual data sequence generator 2B is also an approximate line calculator that calculates approximate line 32 that approximates the temporal change of input data sequence 31. Virtual data sequence generator 2B extrapolates approximate line 32 to the head or the tail of input data sequence 31 to generate virtual data sequence 33 which is a sequence of data representing values on extrapolated approximate line 32 at time points of the predetermined second number that are arranged in succession with the time interval, the time points including the time point that is adjacent to input data sequence 31.

Data sequence connector 9B connects virtual data sequence 33 to a side of input data sequence 31 designated by putting side 36 and generates processed data sequence 34. In a case where putting side 36 is the front side, virtual data sequence 33 is connected to the front side of input data sequence 31 as shown in FIG. 3. In a case where putting side 36 is the rear side, virtual data sequence 33 is connected to the rear side of input data sequence 31 as shown in FIG. 7.

Data sequence connector 9B generates processed data sequence 34 which is a data sequence in which virtual data sequence 33 is connected to the side of input data sequence 31 to which approximate line 32 is extrapolated. Data sequence connector 9B is also a data sequence inputter that inputs the data included in processed data sequence 34 to IIR filter 3 sequentially. Data sequence connector 9B also inputs data to IIR filter 3 from a datum at the end of processed data sequence 34 on the side corresponding to virtual data sequence 33. In a case where putting side 36 is the front side, IQ $(-n_2)$, which is the virtual datum at the earliest time point, is inputted first to IIR filter 3. In a case where putting side 36 is the rear side, IQ $(n_1-1+n_2)$, which is virtual datum at the most delayed time point, is inputted first to IIR filter 3.

In data processing device 1B, the number of data points inputted to IIR filter 3 can be increased. The number of data included in the data sequence inputted to IIR filter 3 can be about twice or more. In a case where the number of data points of input data sequence 31 is small, data processing device 1B can reduce an intended low frequency component more as compared with the prior art with a high probability. In data processing device 1B, IIR filter 3 can reduce the low frequency component in input data sequence 31 more as compared with the prior art.

Furthermore, in data processing device 1B, in a case where the amplitude of the low frequency component included in input data sequence 31 increases with a lapse of time, IIR filter 3 can reduce the low frequency component in input data sequence 31 more as compared with the prior art. This is described in the following.

The inventors have found that in a case where the amplitude of the low frequency component included in input data sequence 31 increases with a lapse of time, the effect of reducing the low frequency component is small by inputting virtual data sequence 33 before the input data sequence. Furthermore, the inventors have found that the effect of reducing the low frequency component by IIR filter 3 is increased by putting virtual data sequence 33 after input data sequence 31 and inputting data included in processed data sequence 34 to IIR filter 3 in a direction of moving back in time from the virtual datum at the latest time point.

On the basis of these findings, the inventors have invented data processing device 1B according to the second embodiment. Data processing device 1B compares magnitudes of amplitudes of IQ data corresponding to the head and the tail of input data sequence 31, and puts virtual data sequence 33 on a side where the amplitude of the IQ datum included in input data sequence 31 is larger. Then, in data processing device 1B, the data are inputted to IIR filter 3 sequentially from the datum at the end of processed data sequence 34 on the side corresponding to virtual data sequence 33. In data processing device 1B, in a case where the amplitude of the low frequency component included in input data sequence 31 increases with a lapse of time, the low frequency component in input data sequence 31 can be also reduced effectively.

In a radar device that is a Doppler radar, reducing a low frequency component in an input data sequence means reducing data of a velocity of around 0 m/s. Therefore, inputting the data included in processed data sequence 34 to IIR filter 3 in a direction of moving back in time only makes a frequency negative, and does not affect the operation of IIR filter 3 adversely.

The amplitude of the complex number representing each datum included in the IQ data generated by phase detector 6 sequentially may be inputted to putting side determiner 11 sequentially. Then, data processing device 1B may receive the start and the end of the time range of input data sequence 31 processed at one time by data processing device 1B from phase detector 6, and obtain the amplitudes of the IQ data from which data at the head and tail of each input data sequence 31 that is processed by data processing device 1B is generated. Instead of comparing the amplitudes of the head and the tail of the IQ data, the average amplitude of a predetermined number of IQ data starting from the head and the average amplitude of a predetermined number of IQ data starting from the tail may be compared.

The putting side determiner is required only to set putting side 36 to the front side in a case where the amplitude of front side detection data that are detection data corresponding to at least part of data in the first half of input data sequence 31 is greater than or equal to the amplitude of rear side detection data that are detection data corresponding to at least part of data in the second half of the input data sequence. The putting side determiner is required only to set putting side 36 to the rear side in a case where the amplitude of the front side detection data is less than the amplitude of the rear side detection data. The detection data are data each represented by a complex number obtained for each pulse by phase detection of the reception signal by phase detector 6. In this specification, detection data are also referred to as IQ data.

The front side detection data may be detection data corresponding to one datum at a predetermined position in the first half of input data sequence 31, or may be a plurality of detection data corresponding to data in a predetermined range in the first half of input data sequence 31. In a case where the front side detection data includes a plurality of data, the amplitude of the front side detection data may be calculated by a simple average, a weighted average, or a method other than the average. The same is applied to the rear side detection data and the amplitude of the rear side detection data. Determining the side on which the virtual data sequence 33 is put by the data inputted from outside such as putting side 36 can also be applied to the modification of the first embodiment and other embodiments.

Third Embodiment

Figure 8:
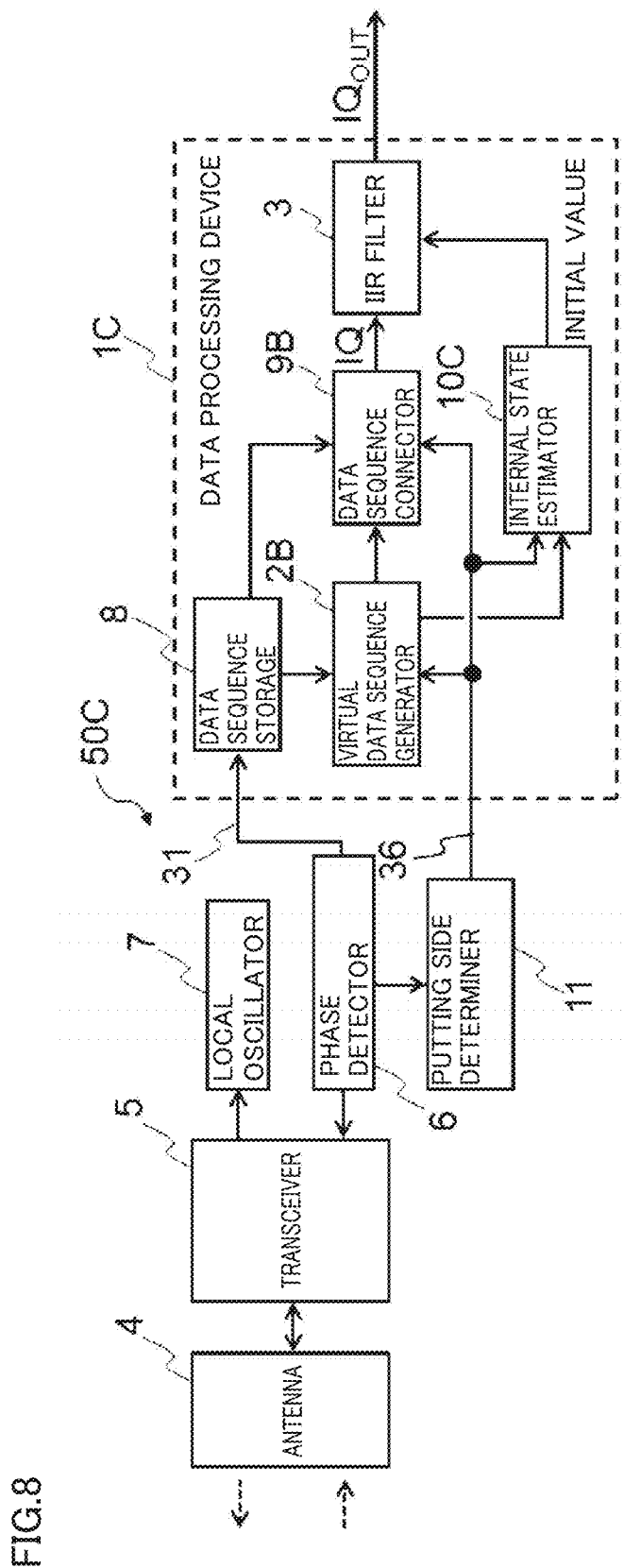
FIG. 8 is a functional block diagram of a radar device including a data processing device according to a third embodiment.
Figure 9:
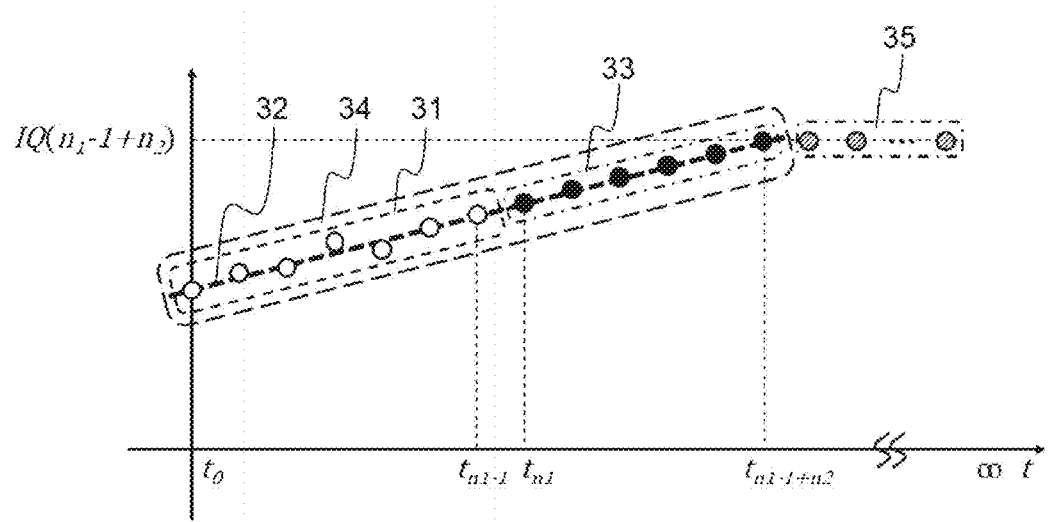
FIG. 9 is a diagram for describing a virtual data sequence and an assumed infinite data sequence generated by the data processing device according to the third embodiment.

A third embodiment is a case where the modification of the first embodiment is modified so as to generate virtual data sequence 33 and assumed infinite data sequence 35 on the front side or the rear side of input data sequence 31. A radar device 50C and a data processing device 1C according to the third embodiment are described with reference to FIGS. 8 and 9. FIG. 8 is a functional block diagram of the radar device including the data processing device according to the third embodiment. FIG. 9 is a diagram for describing virtual data sequence 33 and assumed infinite data sequence 35 generated by the data processing device according to the third embodiment.

In FIG. 8, points different from FIG. 4 in the modification of the first embodiment are described. Radar device 50C includes putting side determiner 11 and data processing device 1C. Data processing device 1C can put virtual data sequence 33 and assumed infinite data sequence 35 into either the front side or the rear side of input data sequence 31. Whether data processing device 1C puts on the front side or the rear side of input data sequence 31 is decided by putting side 36 determined by putting side determiner 11.

In data processing device 1C, virtual data sequence generator 2B, data sequence connector 9B, and an internal state estimator 10C are modified. Virtual data sequence generator 2B and data sequence connector 9B are the same as those included in data processing device 1B. Putting side 36 is inputted to internal state estimator 10C. Internal state estimator 10C estimates each internal state variable of IIR filter 3 on the assumption that assumed infinite data sequence 35 exists on the side of processed data sequence 34 designated by putting side 36.

In a case where putting side 36 is the front side, virtual data sequence 33 and assumed infinite data sequence 35 are set as shown in FIG. 5. Internal state estimator 10C estimates the internal state variable of IIR filter 3 by Formula 1. In a case where putting side 36 is the rear side, virtual data sequence 33 and assumed infinite data sequence 35 are set as shown in FIG. 9. Virtual data sequence 33 is put on the rear side of input data sequence 31. It is assumed that assumed infinite data sequence 35 exists for infinite time on the rear side of virtual data sequence 33. That is, in a case where virtual data sequence 33 is put on the rear side of input data sequence 31, the internal state variable of IIR filter 3 is estimated on the assumption that the following equation (1A) holds.

Where every n satisfies $n \geq n_1 - 1 + n_2$, $$IQ(n) = IQ(n_1 - 1 + n_2) \quad (1A)$$

Internal state estimator 10C estimates the internal state variable of IIR filter 3 at a time point $t_{n1-1+n2}$ on the assumption that time elapses in the reverse direction from a time point when the infinite time has elapsed. Internal state estimator 10C estimates the internal state variable of IIR filter 3 by an equation in which IQ $(-n_2)$ is replaced with IQ $(n \geq n_1 - 1 + n_2)$ in Formula 1.

Internal state estimator 10C sets the estimated initial value of the internal state variable of IIR filter 3 to IIR3. Then, data sequence connector 9B inputs data to IIR filter 3 sequentially from datum IQ $(n \geq n_1 - 1 + n_2)$ at the end of processed data sequence 34 on the side corresponding to virtual data sequence 33.

In data processing device 1C, the number of data points inputted to IIR filter 3 can be increased. In a case where the number of data points of input data sequence 31 is small, data processing device 1C can reduce an intended low frequency component more as compared with the prior art with a high probability. Furthermore, each of the internal state variables of IIR filter 3 is initialized to a value that takes in a steady state according to the value of the datum to be inputted first. Therefore, in data processing device 1C, the time required for the internal state variables to change when the internal variables are initialized to zero is not necessary, and the operation of reducing the low frequency component can be started earlier, resulting in a greater effect of reducing the low frequency component.

In data processing device 1C, in a case where the amplitude of the low frequency component included in input data sequence 31 increases with a lapse of time, the low frequency component in input data sequence 31 can be also reduced effectively.

Fourth Embodiment

Figure 10:
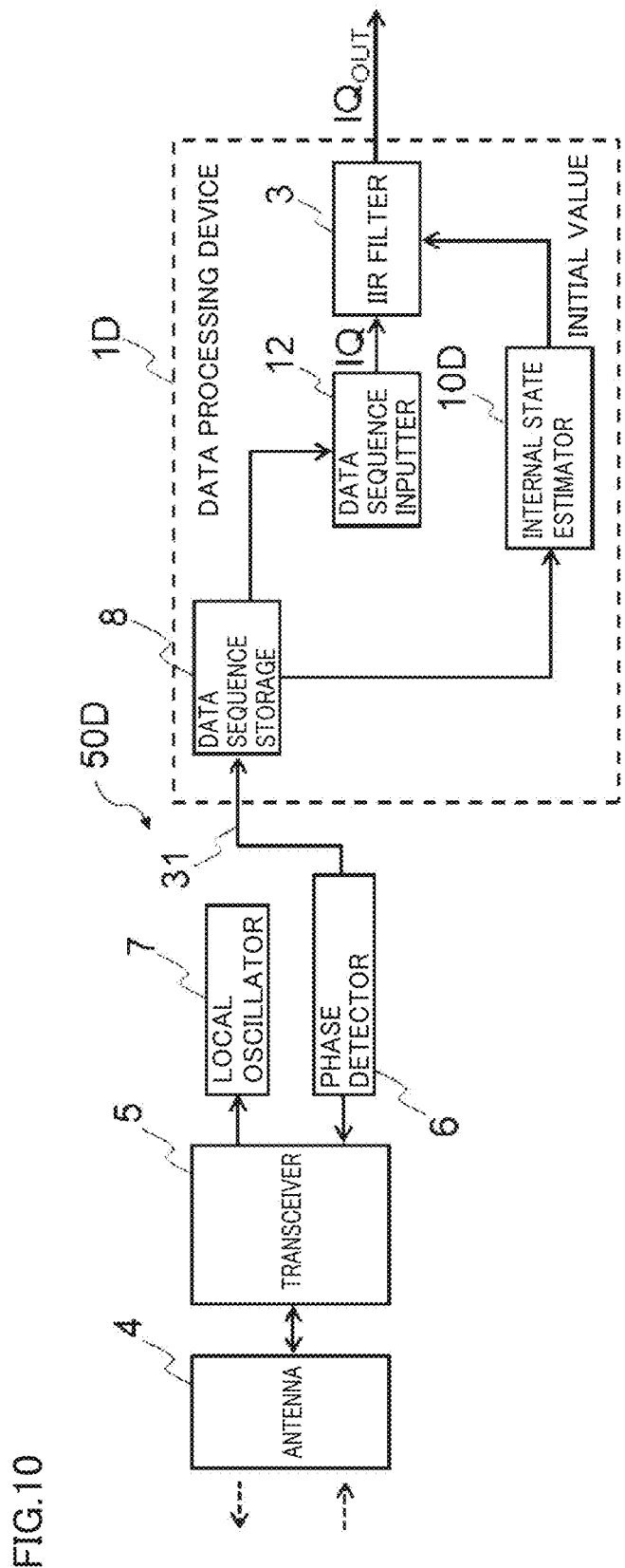
FIG. 10 is a functional block diagram of a radar device including a data processing device according to a fourth embodiment.
Figure 11:
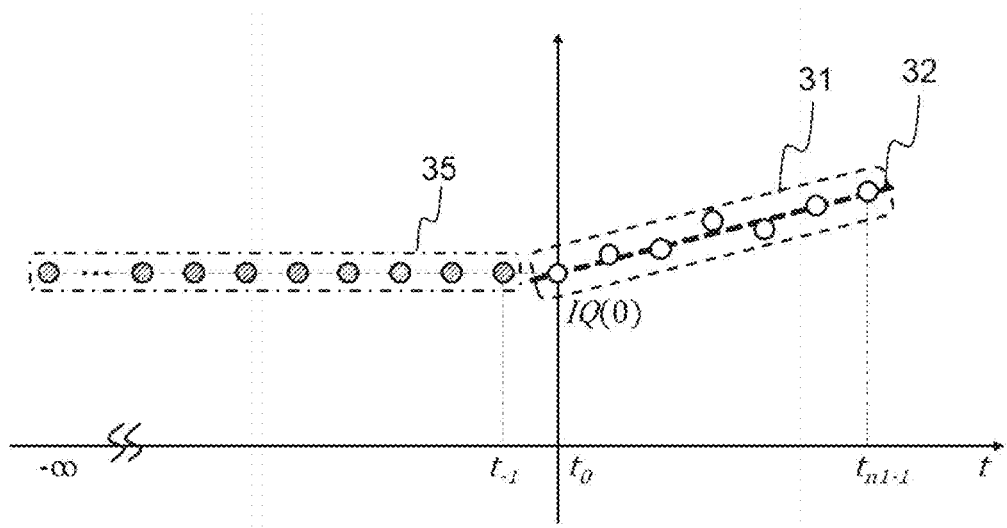
FIG. 11 is a diagram for describing an assumed infinite data sequence generated by the data processing device according to the fourth embodiment.

A fourth embodiment is a case where the modification of the first embodiment is modified so as not to generate virtual data sequence 33. A radar device 50D and a data processing device 1D according to the fourth embodiment are described with reference to FIGS. 10 and 11. FIG. 10 is a functional block diagram of the radar device including the data processing device according to the fourth embodiment. FIG. 11 is a diagram for describing assumed infinite data sequence 35 generated by the data processing device according to the fourth embodiment.

In FIG. 10, points different from FIG. 4 in the modification of the first embodiment are described. In radar device 50D, data processing device 10D is modified. Data processing device 10D does not include virtual data sequence generator 2 and data sequence connector 9. Data processing device 10D includes data sequence inputter 12, and internal state estimator 10D is modified. Internal state estimator 10D assumes that IQ (0), which is the datum at the head of input data sequence 31, is inputted an infinite number of times from the time point infinitely before to a time point $t_0$. That is, in data processing device 10D, internal state variable of IIR filter 3 is estimated on the assumption that the following equation (1B) holds.

Where every n satisfies n≤0, $$IQ(n)=IQ(0) \tag{1B}$$

Internal state estimator 10D estimates the internal state variable of IIR filter 3 at time point $t_0$ assuming that infinite time elapses from the time point infinitely before. Internal state estimator 10D estimates the internal state variable of IIR filter 3 by an equation in which IQ $(-n_2)$ is replaced with IQ (0) in Formula 1.

Internal state estimator 10D sets the estimated initial value of the internal state variable to IIR filter 3. Then, data sequence inputter 12 inputs the data included in input data sequence 31 to IIR filter 3 in the order of elapse of time from IQ (0) which is the datum at the head of input data sequence 31.

In data processing device 1D, each of the internal state variables of IIR filter 3 is initialized to a value that takes in a steady state according to the value of the datum to be inputted first. Therefore, in data processing device 1D, the time required for the internal state variables to change when the internal variables are initialized to zero is not necessary, and the operation of reducing the low frequency component can be started earlier, resulting in a greater effect of reducing the low frequency component.

Fifth Embodiment

Figure 12:
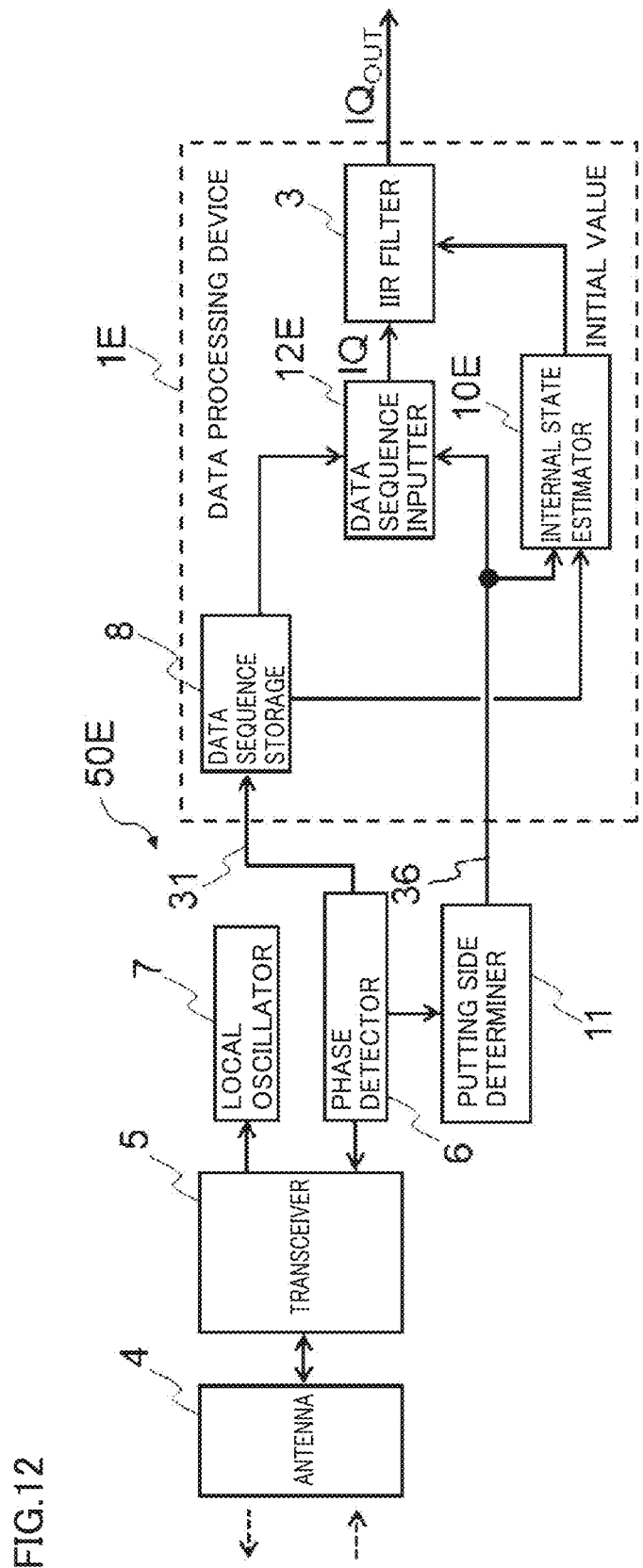
FIG. 12 is a functional block diagram of a radar device including a data processing device according to a fifth embodiment.
Figure 13:
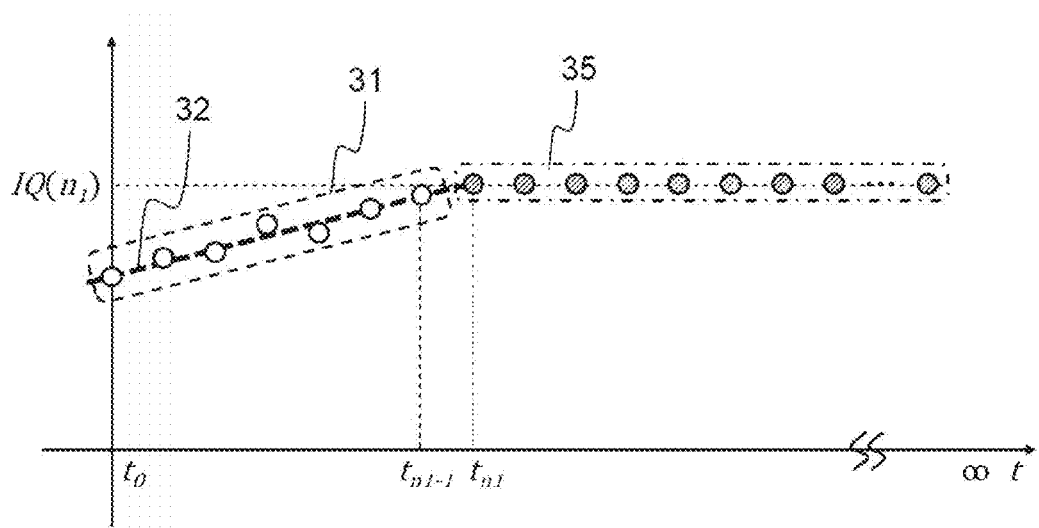
FIG. 13 is a diagram for describing an assumed infinite data sequence generated by the data processing device according to the fifth embodiment.

A fifth embodiment is a case where the fourth embodiment is modified so as to assume that assumed infinite data sequence 35 exists on either the front side or the rear side of input data sequence 31. A radar device 50E and a data processing device 1E according to the fifth embodiment are described with reference to FIGS. 12 and 13. FIG. 12 is a functional block diagram of the radar device including the data processing device according to the fifth embodiment. FIG. 13 is a diagram for describing assumed infinite data sequence 35 generated by the data processing device according to the fifth embodiment.

In FIG. 12, points different from FIG. 10 in the fourth embodiment are described. Radar device 50E includes putting side determiner 11 and data processing device 1E. Data processing device 1E can assume that assumed infinite data sequence 35 exists on either the front side or the rear side of input data sequence 31 depending on the value of putting side 36. Putting side determiner 11 is the same as that included in data processing device 1B or the like. In data processing device 1E, an internal state estimator 10E and a data sequence inputter 12E are modified.

In a case where putting side 36 is the front side, internal state estimator 10E operates in a similar manner to internal state estimator 10, and data sequence inputter 12E operates similarly to data sequence inputter 12. Assumed infinite data sequence 35 shown in FIG. 11 in which equation (1B) holds is assumed, and the initial value of the internal state variable of the IIR filter is obtained and set to IIR filter 3. Data sequence inputter 12E inputs input data sequence 31 starting from IQ (0) that is present at the head to IIR filter 3 sequentially.

In a case where putting side 36 is the rear side, internal state estimator 10E assumes that assumed infinite data sequence 35 exists infinitely on the rear side of input data sequence 31. That is, in a case where virtual data sequence 33 is put on the rear side of input data sequence 31, the internal state variable of IIR filter 3 is estimated on the assumption that the following equation (1C) holds.

Where every n satisfies n≥$n_1$−1, $$IQ(n)=IQ(n_1-1) \tag{1C}$$

FIG. 13 shows assumed infinite data sequence 35 assumed by internal state estimator 10E in a case where putting side 36 is the rear side. In assumed infinite data sequence 35 in a case where putting side 36 is the rear side, internal state estimator 10E assumes that IQ ($n_1$−1), which is the datum at the tail of input data sequence 31, exists infinitely at and after time point $t_{n1}$ on the rear side of input data sequence 31.

Internal state estimator 10E estimates the internal state variable of IIR filter 3 at a time point $t_{n1-1}$ on the assumption that time elapses in the reverse direction from a time point when the infinite time has elapsed. Internal state estimator 10C estimates the internal state variable of IIR filter 3 by an equation in which IQ $(-n_2)$ is replaced with IQ ($n_1$−1) in Formula 1.

In a case where putting side 36 is the rear side, data sequence inputter 12E inputs input data sequence 31 to IIR filter 3 in reverse order of lapse of time starting from IQ ($n_1$−1) that is present at the tail.

In data processing device 1E, each of the internal state variables of IIR filter 3 is initialized to a value that takes in a steady state according to the value of the datum to be inputted first. Therefore, in data processing device 1E, the time required for the internal state variables to change when the internal variables are initialized to zero is not necessary, and the operation of reducing the low frequency component can be started earlier, resulting in a greater effect of reducing the low frequency component.

In data processing device 1E, in a case where the amplitude of the low frequency component included in input data sequence 31 increases with a lapse of time, the low frequency component in input data sequence 31 can be also reduced effectively.

Sixth Embodiment

Figure 14:
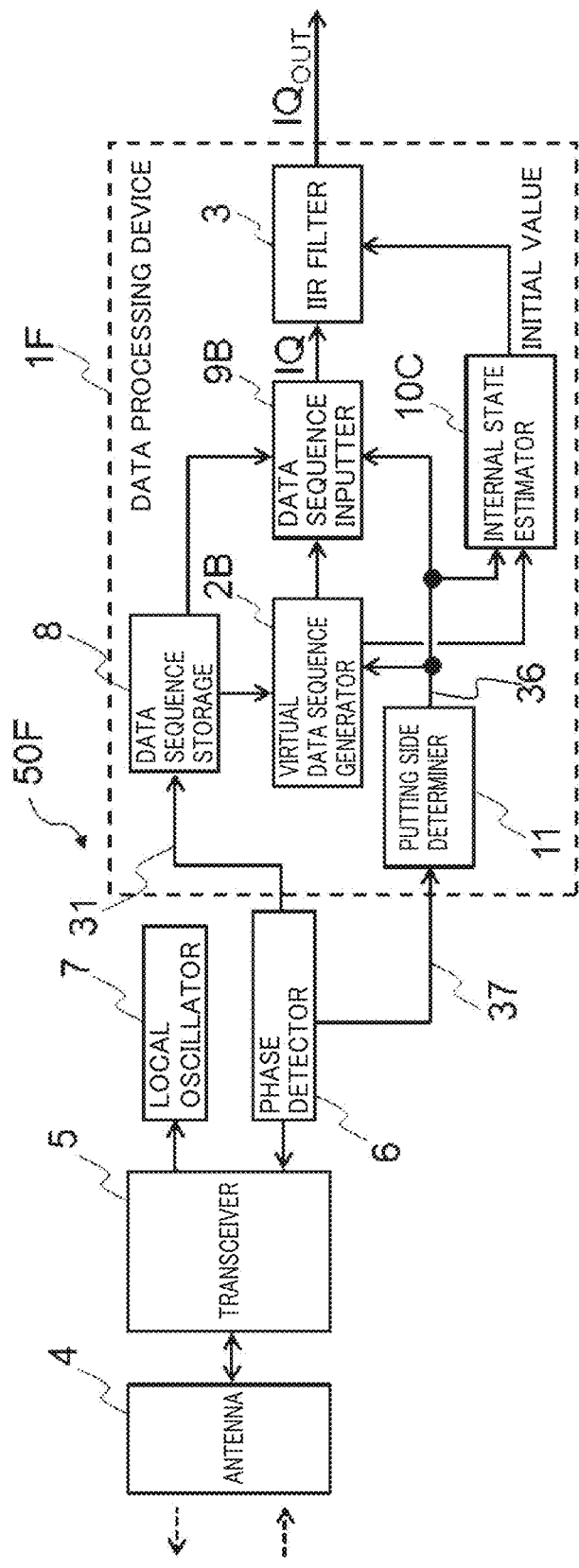
FIG. 14 is a functional block diagram of a radar device including a data processing device according to a sixth embodiment.

A sixth embodiment is a case where the second embodiment is modified such that a data processing device 1F includes putting side determiner 11. A radar device 50F and a data processing device 1F according to the sixth embodiment are described with reference to FIG. 14. FIG. 14 is a functional block diagram of the radar device including the data processing device according to the sixth embodiment.

In FIG. 14, points different from FIG. 6 in the second embodiment are described. Radar device 50F does not include putting side determiner 11. Data processing device 1F includes putting side determiner 11. Putting side determiner 11 receives IQ amplitude data 37 from phase detector 6. IQ amplitude data 37 are amplitude data of IQ data corresponding to the head and the tail of each input data sequence 31 that is processed by data processing device 1F. Putting side determiner 11 operates as in a case where the putting side determiner exists outside data processing device 1F, and outputs putting side 36. Putting side 36 is inputted to virtual data sequence generator 2B and data sequence connector 9B. Virtual data sequence generator 2B, data sequence connector 9B, and internal state estimator 10 are the same and operate in the same manner as those included in data processing device 1B.

Data processing device 1F operates in a similar manner to data processing device 1B, and a similar effect can be obtained.

Modifying the data processing device so as to include the putting side determiner that determines the data (putting side 36) designating whether virtual data sequence 33 is put on the front side or the rear side of input data sequence 1 can also be applied to other embodiments such as the fifth embodiment and the modifications of the embodiments.

Seventh Embodiment

Figure 15:
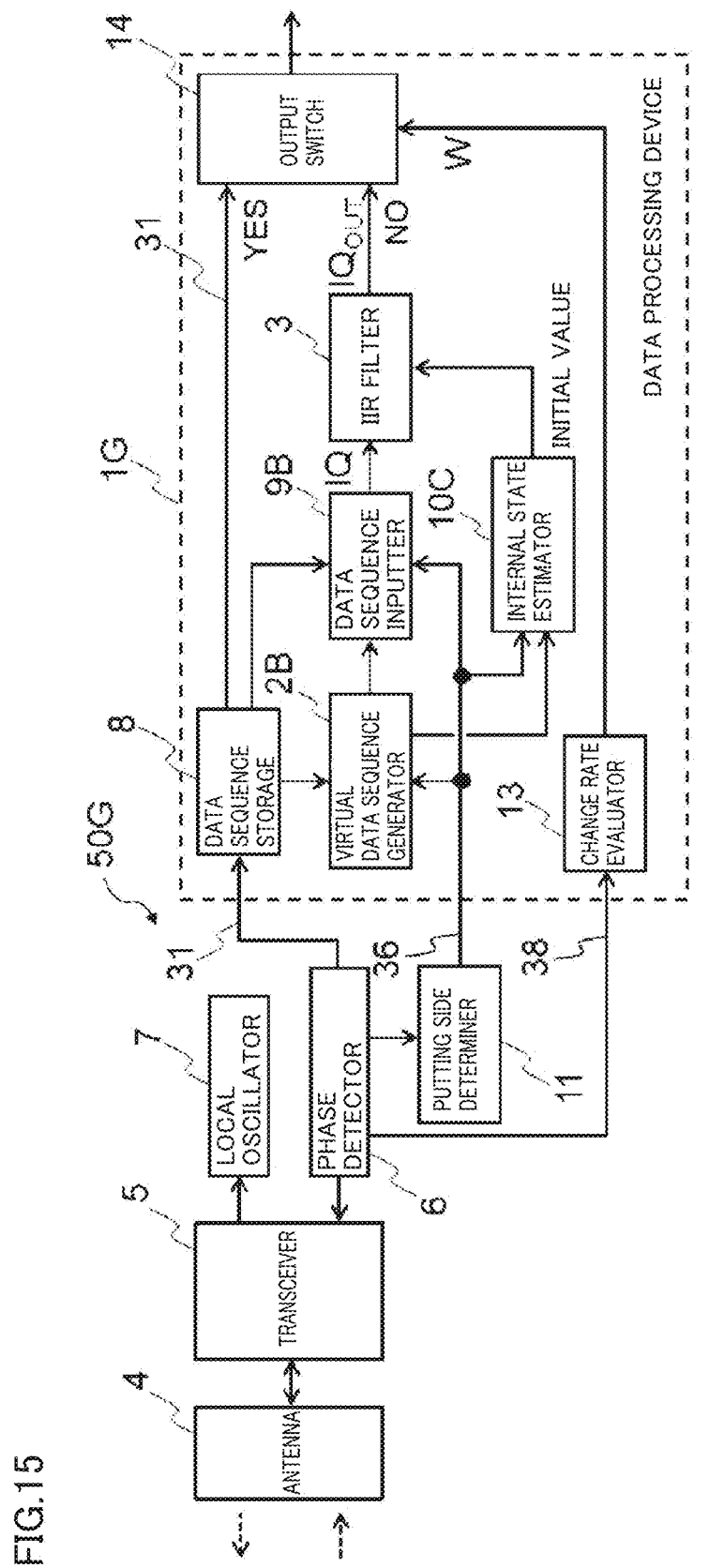
FIG. 15 is a functional block diagram of a radar device including a data processing device according to a seventh embodiment.

A seventh embodiment is a case where the fourth embodiment is modified such that the data processing device outputs data by switching either the data sequence outputted from IIR filter 3 or input data sequence 31. A radar device 50G and a data processing device 1G according to the seventh embodiment are described with reference to FIG. 15. FIG. 15 is a functional block diagram of the radar device including the data processing device according to the seventh embodiment.

In a case where a temporal change of the phases of the IQ data is sufficiently large, it is known that a variation component of a low frequency (low frequency component) included in input data sequence 31 is small. In the case where the temporal change of the amplitudes of the IQ data is sufficiently large, the low frequency component is not required to be removed from input data sequence 31 by IIR filter 3. In the case where the temporal change of the phases of the IQ data is sufficiently large, radar device 50G and data processing device 1G according to the seventh embodiment output input data sequence 31 directly as the output of data processing device 1G.

In FIG. 15, points different from FIG. 8 in the third embodiment are described. Data processing device 1G is modified. Data processing device 1G includes a change rate evaluator 13 and an output switch 14. Output switch 14 switches which one of input data sequence 31 or the output of IIR filter 3 is outputted as the output of data processing device 1G. The output is switched in accordance with an evaluation result of change rate evaluator 13.

IQ phase data 38 are inputted from phase detector 6 to change rate evaluator 13. IQ phase data 38 are data of the phase of the IQ data outputted from phase detector 6. Every time input data sequence 31 is processed, IQ phase data 38 corresponding to input data sequence 31 are inputted to change rate evaluator 13. Change rate evaluator 13 calculates a change rate (temporal change rate) of IQ phase data 38 with respect to time. The temporal change rate may be calculated as an absolute value of a slope of an approximate straight line by linearly approximating a temporal change of IQ phase data 38. Alternatively, the absolute value of the average of differences between IQ phase data 38 at time points that are adjacent each other may be used as the temporal change rate. The temporal change rate may be calculated by any method as long as the temporal change rate represents a magnitude of the temporal change of IQ phase data 38.

The temporal change rate calculated by change rate evaluator 13 is denoted by a variable V. Change rate evaluator 13 compares temporal change rate V with a threshold value Th. The comparison result (evaluation result) is denoted by a variable W. When temporal change rate V is greater than or equal to threshold value Th (V≥Th), change rate evaluator 13 outputs an evaluation result W=YES. When temporal change rate V is less than threshold value Th (V<Th), change rate evaluator 13 outputs an evaluation result W=NO. Output switch 14 outputs input data sequence 31 as the output of data processing device 1G in a case of evaluation result W=YES. Output switch 14 outputs the output of IIR filter 3 as the output of data processing device 1G in a case of evaluation result W=NO.

In the drawing, output switch 14 has two input terminals of YES and NO. Output switch 14 outputs data inputted to one of the two input terminals of YES and NO according to the value inputted to evaluation result W. In the case of evaluation result W=YES, output switch 14 outputs input data sequence 31 inputted to the input terminal of YES. In the case of evaluation result W=NO, output switch 14 outputs the output of IIR filter 3 inputted to the input terminal of NO. Output switch 14 may be implemented by a mechanical switch or may be achieved by software. Output switch 14 may be any unit as long as being able to switch and output one of the two inputs.

Data processing device 1G, the number of data points inputted to IIR filter 3 can be increased. In a case where the number of data points of input data sequence 31 is small, data processing device 1G can reduce an intended low frequency component more as compared with the prior art with a high probability. Furthermore, each of the internal state variables of IIR filter 3 is initialized to a value that takes in a steady state according to the value of the datum to be inputted first. Therefore, in data processing device 1G the time required for the internal state variables to change when the internal variables are initialized to zero is not necessary, and the operation of reducing the low frequency component can be started earlier, resulting in a greater effect of reducing the low frequency component.

In data processing device 1G, in a case where the amplitude of the low frequency component included in input data sequence 31 increases with a lapse of time, the low frequency component in input data sequence 31 can be also reduced effectively.

In data processing device 1G, a case where the temporal change rate of the phases of the IQ data is greater than or equal to a threshold value is regarded as a case where the low frequency component is not required to be removed from input data sequence 31, and input data sequence 31 is outputted directly. Since data processing device 1G does not operate when the processing in IIR filter 3 is unnecessary, a total processing amount of radar device 50G can be reduced.

In other embodiments and modifications of the embodiments, the IIR filter may be modified so as to operate only when necessary.

The data processing device may output the processed data sequence in the case where the temporal change rate of the phases of the IQ data is greater than or equal to a threshold value. Since processed data sequence 34 includes input data sequence 31, a case where the data processing device outputs input data sequence 31 can also be said a case where the data processing device outputs processed data sequence 34.

Eighth Embodiment

Figure 16:
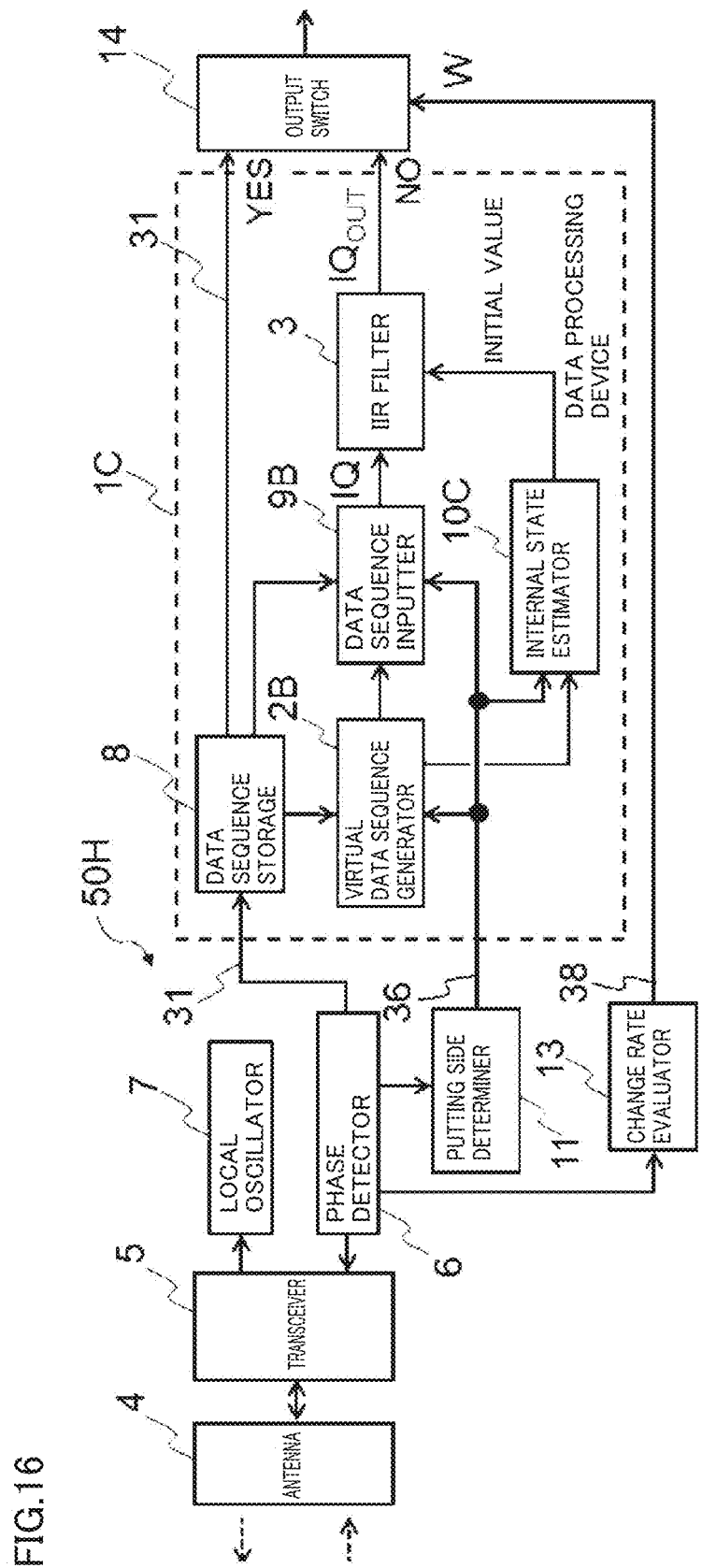
FIG. 16 is a functional block diagram of a data processing device and a radar device according to an eighth embodiment.

An eighth embodiment is a case where the seventh embodiment is modified such that change rate evaluator 13 and output switch 14 are provided outside data processing device 1D. A radar device 50H and data processing device 1C according to the eighth embodiment are described with reference to FIG. 16. FIG. 16 is a functional block diagram of the data processing device and the radar device according to the eighth embodiment.

In FIG. 16, points different from FIG. 15 in the seventh embodiment are described. Radar device 50H includes change rate evaluator 13 and output switch 14. Data processing device 1C does not include change rate evaluator 13 and output switch 14. Data processing device 1C is the same as that included in radar device 50C.

Radar device 50H operates in a similar manner to radar device 50G, and a similar effect can be obtained.

Data processing device 1C has a simpler configuration than data processing device 1G. A general-purpose data processing device that does not have a function unique to the radar device can be used in the radar device.

Even in a device different from the radar device, the data sequence processed by the data processing device or the input data sequence to the data processing device may be switched and used.

The embodiments can be freely combined, or can be modified or omitted.

REFERENCE SIGNS LIST 50, 50A, 50B, 50C, 50D, 50E, 50F, 50G, 50H: radar device, 1, 1A, 1B, 1C, 1D, 1E, 1F, 1G: data processing device (reception signal data processing device), 2, 2B: virtual data sequence generator (approximate line calculator), 3: IIR filter (infinite impulse response filter), 4: antenna, 5: transceiver, 6: phase detector, 7: local oscillator, 8: data sequence storage, 9, 9B: data sequence connector (data sequence inputter), 10, 10C, 10D, 10E: internal state estimator (filter internal state estimator, filter internal state setter), 11: putting side determiner, 12, 12E: data sequence inputter, 13: change rate evaluator, 14: output switch, 31: input data sequence, 32: approximate line, 33: virtual data sequence, 34: processed data sequence, 35: assumed infinite data sequence, 36: putting side, 37: IQ amplitude data, 38: IQ phase data

The invention claimed is:

1. A data processing device comprising:
a processor configured to
calculate an approximate line approximating a temporal change of an input data sequence being a sequence of data at time points of a predetermined first number, the time points of the first number being arranged in succession with a predetermined time interval, the input data sequence being inputted from outside;
extrapolate the approximate line to a head or a tail of the input data sequence and to generate a virtual data sequence being a sequence of data representing values on the extrapolated approximate line at time points of a predetermined second number, the time points of the second number being arranged in succession with the time interval, and including a time point being adjacent to the input data sequence;
generate a processed data sequence being a data sequence in which the virtual data sequence is connected to the input data sequence on a side where the approximate line of the input data sequence is extrapolated;
operate as an infinite impulse response (IIR) filter to process a data sequence that is inputted and to output a data sequence in which a low frequency component is reduced as compared with the data sequence that is inputted, the low frequency component being a component varying at a low frequency;
input data included in the processed data sequence to the IIR filter sequentially; and
output the data sequence outputted from the IIR filter to the outside.

2. The data processing device according to claim 1, wherein the processor generates the virtual data sequence based on the approximate line extrapolated to the head of the input data sequence in a case where a putting side is a front side, and the processor generates the virtual data sequence based on the approximate line extrapolated to the tail of the input data sequence in a case where the putting side is a rear side.

3. The data processing device according to claim 1, wherein
the second number is a finite value, and
the processor inputs data to the IIR filter from a datum at an end of the processed data sequence on a side being the virtual data sequence.

4. The data processing device according to claim 1, wherein an internal state variable of the IIR filter is initialized to zero before the data included in the processed data sequence are inputted.

5. The data processing device according to claim 3, wherein the processor is further configured to:
obtain a value of the internal state variable of the IIR filter when a same datum as a first datum is inputted to the IIR filter an infinite number of times, the first datum being a datum in the data sequence to be inputted first to the IIR filter; and
set the value of the internal state variable obtained by the processor to the internal state variable of the IIR filter before the processor inputs the first datum to the IIR filter.

6. A data processing device comprising:
a processor configured to
operate as an infinite impulse response (IIR) filter a data sequence that is inputted and to output a data sequence in which a low frequency component is reduced as compared with the data sequence that is inputted, the low frequency component being a component varying at a low frequency;
input data included in an input data sequence to the IIR filter sequentially from a head or a tail of the input data sequence, the input data sequence being inputted from outside, and being a sequence of data at time points of a predetermined first number, the time points of the first number being arranged in succession with a predetermined time interval;
obtain a value of an internal state variable of the IIR filter when a same datum as a first datum is inputted to the IIR filter an infinite number of times, the first datum being a datum in the data sequence to be inputted first to the IIR filter;
set the value of the internal state variable obtained by the processor to the internal state variable of the IIR filter before the processor inputs the first datum to the IIR filter; and
output the data sequence outputted from the IIR filter to the outside.

7. The data processing device according to claim 6, wherein
the processor inputs data sequentially from the head of the input data sequence to the IIR filter in a case where a putting side is a front side, and
the processor inputs data sequentially from the tail of the input data sequence to the IIR filter in a case where the putting side is a rear side.

8. The data processing device according to claim 2, wherein the processor is further configured to determine the putting side.

9. The data processing device according to claim 1, wherein
the input data sequence is a reception signal data sequence being a sequence of reception signal data each generated, for each pulse, from a reception signal generated from reception of a reflected wave in which the pulse of an electromagnetic wave emitted into a space at a pulse repetition cycle is reflected by an observation target in the space, and
the time interval is determined by the pulse repetition cycle.

10. The data processing device according to claim 9, wherein the reception signal data each is a datum representing a phase or an amplitude of a complex number obtained by performing phase detection for the reception signal.

11. The data processing device according to claim 10, wherein the processor is further configured to:
determine whether a change rate of the reception signal data with respect to time is greater than or equal to a threshold value, the reception signal data each being the datum representing the phase of the complex number; and
output either the input data sequence or the data sequence outputted from the IIR filter to the outside, wherein
the processor outputs the input data sequence to the outside in a case where the change rate is greater than or equal to the threshold value, and outputs the data sequence outputted from the IIR filter to the outside in a case where the change rate is less than the threshold value.

12. A radar device comprising:
an antenna to emit a pulse of a transmission wave being an electromagnetic wave into a space at a pulse repetition cycle and to receive a reflected wave in which the electromagnetic wave is reflected by an observation target in the space;
a transceiver connected to the antenna and to perform processing of transmitting the transmission wave and processing of receiving a reception signal generated by the antenna receiving the reflected wave; and
a reception signal data processing device connected to the transceiver, the reception signal data processing device being the data processing device according to claim 1, being inputted, as the input data sequence with the time interval being determined by the pulse repetition cycle, a sequence of reception signal data each generated, for each pulse, from the reception signal.

13. The radar device according to claim 12, further comprising a phase detector to perform phase detection for the reception signal and to generate detection data each represented by one complex number for each of the pulse, wherein
an amplitude or a phase of each of the detection data is the reception signal data.

14. The data processing device according to claim 7, wherein the processor is further configured to determine the putting side.

15. A radar device comprising:
an antenna to emit a pulse of a transmission wave being an electromagnetic wave into a space at a pulse repetition cycle and to receive a reflected wave in which the electromagnetic wave is reflected by an observation target in the space;
a transceiver connected to the antenna and to perform processing of transmitting the transmission wave and processing of receiving a reception signal generated by the antenna receiving the reflected wave;
a phase detector to perform phase detection for the reception signal and to generate detection data each represented by one complex number for each of the pulse; and
a reception signal data processing device connected to the transceiver, the reception signal data processing device being the data processing device according to claim 2, being inputted, as the input data sequence with the time interval being determined by the pulse repetition cycle, a sequence of reception signal data each generated, for each pulse, from the reception signal,
wherein the processor is further configured to determine the putting side based on the amplitude of the detection data corresponding to the input data sequence, and
an amplitude or a phase of each of the detection data is the reception signal data.

16. The radar device according to claim 15 wherein
the processor sets the putting side to the front side in a case where the amplitude of front side detection data being the detection data corresponding to at least part of data in a first half of the input data sequence is greater than or equal to the amplitude of rear side detection data being the detection data corresponding to at least part of data in a second half of the input data sequence, and
the processor sets the putting side to the rear side in a case where the amplitude of the front side detection data is less than the amplitude of the rear side detection data.

17. The radar device according to claim 15, wherein the processor is further configured to:
determine whether a change rate of the phase of the detection data with respect to time is greater than or equal to a threshold value; and
set either the input data sequence or the data sequence outputted from the IIR filter as output of the data processing device, wherein
the processor outputs the input data sequence as the output of the data processing device in a case where the change rate is greater than or equal to the threshold value, and
the processor outputs the data sequence outputted from the IIR filter as the output of the data processing device in a case where the change rate is less than the threshold value.

18. A radar device comprising:
an antenna to emit a pulse of a transmission wave being an electromagnetic wave into a space at a pulse repetition cycle and to receive a reflected wave in which the electromagnetic wave is reflected by an observation target in the space;
a transceiver connected to the antenna and to perform processing of transmitting the transmission wave and processing of receiving a reception signal generated by the antenna receiving the reflected wave;
a phase detector to perform phase detection for the reception signal and to generate detection data each represented by one complex number for each of the pulse; and
a reception signal data processing device connected to the transceiver, the reception signal data processing device being the data processing device according to claim 7, being inputted, as the input data sequence with the time interval being determined by the pulse repetition cycle, a sequence of reception signal data each generated, for each pulse, from the reception signal, wherein the processor is further configured to determine the putting side based on the amplitude of the detection data corresponding to the input data sequence, and an amplitude or a phase of each of the detection data is the reception signal data.

19. The radar device according to claim 18 wherein the processor sets the putting side to the front side in a case where the amplitude of front side detection data being the detection data corresponding to at least part of data in a first half of the input data sequence is greater than or equal to the amplitude of rear side detection data being the detection data corresponding to at least part of data in a second half of the input data sequence, and the processor sets the putting side to the rear side in a case where the amplitude of the front side detection data is less than the amplitude of the rear side detection data.

20. The radar device according to claim 18, wherein the processor is further configured to:

determine whether a change rate of the phase of the detection data with respect to time is greater than or equal to a threshold value; and switch either the input data sequence or the data sequence outputted from the IIR filter and to set either the input data sequence or the data sequence as output of the data processing device, wherein the processor outputs the input data sequence as the output of the data processing device in a case where the change rate is greater than or equal to the threshold value, and the processor outputs the data sequence outputted from the IIR filter as the output of the data processing device in a case where the change rate is less than the threshold value.

21. A data processing device, comprising:

an infinite impulse response (IIR) filter to process a data sequence that is inputted and to output a data sequence in which a low frequency component is reduced as compared to the sequence that is inputted, the low frequency component being a component varying at a low frequency;

a processor configured to calculate an approximate line approximating a temporal change of an input data sequence being a sequence of data at time points of a predetermined first number, the time points of the first number being arranged in succession with a predetermined time interval, the input data sequency being inputted from outside;

extrapolate the approximate line to a head or a tail of the input data sequence and to generate a virtual data sequence being a sequence of data representing values on the extrapolated approximate line at time points of a predetermined second number, the time points of the second number being arranged in succession with the time interval, and including a time point being adjacent to the input data sequence;

generate a processed data sequence being a data sequence in which the virtual data sequence is connected to the input data sequence on a side where the approximate line of the input data sequence is extrapolated;

input data included in the processed data sequence to the IIR filter sequentially; and output the data sequence outputted from the IIR filter to the outside.

22. The data processing device according to claim 21, wherein the processor generates the virtual data sequence based on the approximate line extrapolated to the head of the input data sequence in a case where a putting side is a front side, and the processor generates the virtual data sequence based on the approximate line extrapolated to the tail of the input data sequence in a case where the putting side is a rear side.

23. The data processing device according to claim 21, wherein the second number is a finite value, and the processor inputs data to the IIR filter from datum at an end of the processed data sequence on a side being the virtual data sequence.

24. The data processing device according to claim 21, wherein an internal state variable of the IIR filter is initialized to zero before the data included in the processed data sequence are inputted.

25. The data processing device according to claim 23, wherein the processor is further configured to:

obtain a value of the internal state variable of the IIR filter when a same datum as a first datum is inputted to the IIR filter an infinite number of times, the first datum being a datum in the data sequence to be inputted first to the IIR filter; and set the value of the internal state variable obtained by the processor to the internal state variable of the IIR filter before the processor inputs the first datum to the IIR filter.

26. A data processing device comprising:

an infinite impulse response (IIR) filter to process a data sequence that is inputted and to output a data sequence in which a low frequency component is reduced as compared with the data sequence that is inputted, the low frequency component being a component varying at a low frequency;

a processor configure to:

input data included in an input data sequence to the IIR filter sequentially from a head or a tail of the input data sequence, the input data sequence being inputted from outside, and being a sequence of data at time points of a predetermined first number, the time points of the first number being arranged in succession with a predetermined time interval;

obtain a value of an internal state variable of the IIR filter when a same datum as a first datum is inputted to the IIR filter an infinite number of times, the first datum being a datum in the data sequence to be inputted first to the IIR filter;

set the value of the internal state variable obtained by the processor to the internal state variable of the IIR filter before the processor inputs the first datum to the IIR filter; and output the data sequence outputted from the IIR filter to the outside.

27. The data processing device according to claim 26, wherein the processor inputs data sequentially from the head of the input data sequence to the IIR filter in a case where a putting side is a front side, and the processor inputs data sequentially from the tail of the input data sequence to the IIR filter in a case where the putting side is a rear side.

28. The data processing device according to claim 22, wherein the processor is further configured to determine the putting side.

29. The data processing device according to claim 21, wherein the input data sequence is a reception signal data sequence being a sequence of reception signal data each generated, for each pulse, from a reception signal generated from reception of a reflected wave in which the pulse of an electromagnetic wave emitted into a space at a pulse repetition cycle is reflected by an observation target in the space, and the time interval is determined by the pulse repetition cycle.

30. The data processing device according to claim 29, wherein the reception signal data each is a datum representing a phase or an amplitude of a complex number obtained by performing phase detection for the reception signal.

31. The data processing device according to claim 30, wherein the processor is further configured to:

determine whether a change rate of the reception signal data with respect to time is greater than or equal to a threshold value, the reception signal data each being the datum representing the phase of the complex number; and output either the input data sequence or the data sequence outputted from the IIR filter to the outside, wherein the processor outputs the input data sequence to the outside in a case where the change rate is greater than or equal to the threshold value, and outputs the data sequence outputted from the IIR filter to the outside in a case where the change rate is less than the threshold value.

32. A radar device comprising:

an antenna to emit a pulse of a transmission wave being an electromagnetic wave into a space at a pulse repetition cycle and to receive a reflected wave in which the electromagnetic wave is reflected by an observation target in the space;

a transceiver connected to the antenna and to perform processing of transmitting the transmission wave and processing of receiving a reception signal generated by the antenna receiving the reflected wave; and a reception signal data processing device connected to the transceiver, the reception signal data processing device being the data processing device according to claim 21, being inputted, as the input data sequence with the time interval being determined by the pulse repetition cycle, a sequence of reception signal data each generated, for each pulse, from the reception signal.

33. The radar device according to claim 32, wherein the processor is further configured to perform phase detection for the reception signal and to generate detection data each represented by one complex number for each of the pulse, wherein an amplitude or a phase of each of the detection data is the reception signal data.

34. The data processing device according to claim 27, wherein the processor is further configured to determine the putting side.

35. A radar device comprising:

an antenna to emit a pulse of a transmission wave being an electromagnetic wave into a space at a pulse repetition cycle and to receive a reflected wave in which the electromagnetic wave is reflected by an observation target in the space;

a transceiver connected to the antenna and to perform processing of transmitting the transmission wave and processing of receiving a reception signal generated by the antenna receiving the reflected wave;

a phase detector to perform phase detection for the reception signal and to generate detection data each represented by one complex number for each of the pulse; and a reception signal data processing device connected to the transceiver, the reception signal data processing device being the data processing device according to claim 22, being inputted, as the input data sequence with the time interval being determined by the pulse repetition cycle, a sequence of reception signal data each generated, for each pulse, from the reception signal, wherein the processor is further configured to determine the putting side based on the amplitude of the detection data corresponding to the input data sequence, and an amplitude or a phase of each of the detection data is the reception signal data.

36. The radar device according to claim 35 wherein the processor sets the putting side to the front side in a case where the amplitude of front side detection data being the detection data corresponding to at least part of data in a first half of the input data sequence is greater than or equal to the amplitude of rear side detection data being the detection data corresponding to at least part of data in a second half of the input data sequence, and the processor sets the putting side to the rear side in a case where the amplitude of the front side detection data is less than the amplitude of the rear side detection data.

37. The radar device according to claim 35, wherein the processor is further configured to:

determine whether a change rate of the phase of the detection data with respect to time is greater than or equal to a threshold value; and set either the input data sequence or the data sequence outputted from the IIR filter as output of the data processing device, wherein the processor outputs the input data sequence as the output of the data processing device in a case where the change rate is greater than or equal to the threshold value, and the processor outputs the data sequence outputted from the IIR filter as the output of the data processing device in a case where the change rate is less than the threshold value.

38. A radar device comprising:

an antenna to emit a pulse of a transmission wave being an electromagnetic wave into a space at a pulse repetition cycle and to receive a reflected wave in which the electromagnetic wave is reflected by an observation target in the space;

a transceiver connected to the antenna and to perform processing of transmitting the transmission wave and processing of receiving a reception signal generated by the antenna receiving the reflected wave;

a phase detector to perform phase detection for the reception signal and to generate detection data each represented by one complex number for each of the pulse; and a reception signal data processing device connected to the transceiver, the reception signal data processing device being the data processing device according to claim 27, being inputted, as the input data sequence with the time interval being determined by the pulse repetition cycle, a sequence of reception signal data each generated, for each pulse, from the reception signal, wherein the processor is further configured to determine the putting side based on the amplitude of the detection data corresponding to the input data sequence, and an amplitude or a phase of each of the detection data is the reception signal data.

39. The radar device according to claim 38 wherein
the processor sets the putting side to the front side in a case where the amplitude of front side detection data being the detection data corresponding to at least part of data in a first half of the input data sequence is greater than or equal to the amplitude of rear side detection data being the detection data corresponding to at least part of data in a second half of the input data sequence, and
the processor sets the putting side to the rear side in a case where the amplitude of the front side detection data is less than the amplitude of the rear side detection data.

40. The radar device according to claim 38, wherein the processor is further configured to:
determine whether a change rate of the phase of the detection data with respect to time is greater than or equal to a threshold value; and
set either the input data sequence or the data sequence outputted from the IIR filter as output of the data processing device, wherein
the processor outputs the input data sequence as the output of the data processing device in a case where the change rate is greater than or equal to the threshold value, and
the processor outputs the data sequence outputted from the IIR filter as the output of the data processing device in a case where the change rate is less than the threshold value.

* * * * *